(12) United States Patent
Iwaki et al.

(10) Patent No.: US 6,789,956 B2
(45) Date of Patent: Sep. 14, 2004

(54) OPTICAL MODULE

(75) Inventors: Hideki Iwaki, Ibaraki (JP); Yutaka Taguchi, Takatsuki (JP); Tetsuyosi Ogura, Settsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 10/326,239

(22) Filed: Dec. 19, 2002

(65) Prior Publication Data

US 2003/0123815 A1 Jul. 3, 2003

(30) Foreign Application Priority Data

Dec. 19, 2001 (JP) ........................................ 2001-386189

(51) Int. Cl.[7] ................................................ G02B 6/36

(52) U.S. Cl. ....................................................... 385/88

(58) Field of Search ............................. 385/88, 92, 94, 385/14, 129–131, 49

(56) References Cited

U.S. PATENT DOCUMENTS 6,717,255 B2 * 4/2004 Oggioni et al. ............. 257/690
2004/0081385 A1 * 4/2004 Karnacewicz et al. ........ 385/14

FOREIGN PATENT DOCUMENTS

JP 6-164150 6/1994
JP 2001-345456 12/2001

* cited by examiner

Primary Examiner—Thien M. Le
Assistant Examiner—Edwyn Labaze
(74) Attorney, Agent, or Firm—Merchant & Gould P.C.

(57) ABSTRACT

An optical module of the present invention is provided with a substrate that includes an insulating layer, a passive element provided inside or on the surface of the insulating layer, and terminal electrodes formed on the surface of the insulating layer, and with at least one active element, which includes at least an optical element and is connected to the terminal electrodes on the substrate surface. The passive element has a dielectric layer, a resistive layer, or a magnetic layer, at least one of the terminal electrodes is connected to the passive element, and at least one of the at least one active element has a protruding electrode and is flip-chip mounted to the terminal electrodes on a principle face of the substrate via the protruding electrode. Taking a plane parallel to the principle face of the substrate as a projection plane, then an area of orthographic projection of the dielectric layer, the resistive layer, or the magnetic layer is smaller than an area of orthographic projection of the principle face of the substrate, and the dielectric layer, the resistive layer, or the magnetic layer is formed such that the orthographic projection, with respect to the projection plane, of all the protruding electrodes of the at least one active element that is flip-chip mounted to the principle face of the substrate is included in the orthographic projection of the dielectric layer, the resistive layer, or the magnetic layer. Thus, the optical module has good high frequency properties and the optical element can be mounted stably onto the substrate.

26 Claims, 22 Drawing Sheets

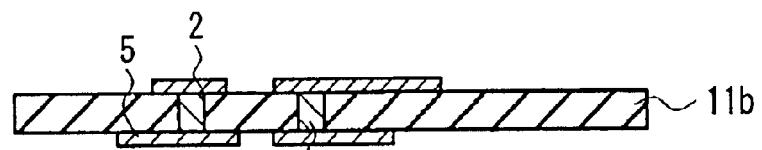
FIG. 14A
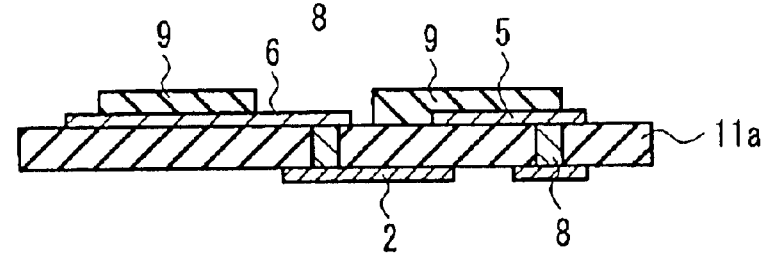
FIG. 14B
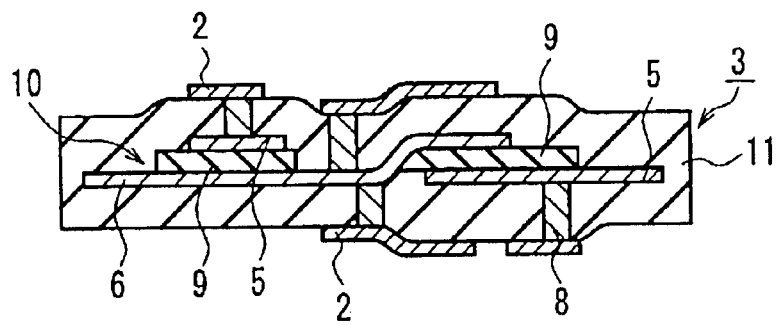
FIG. 14C
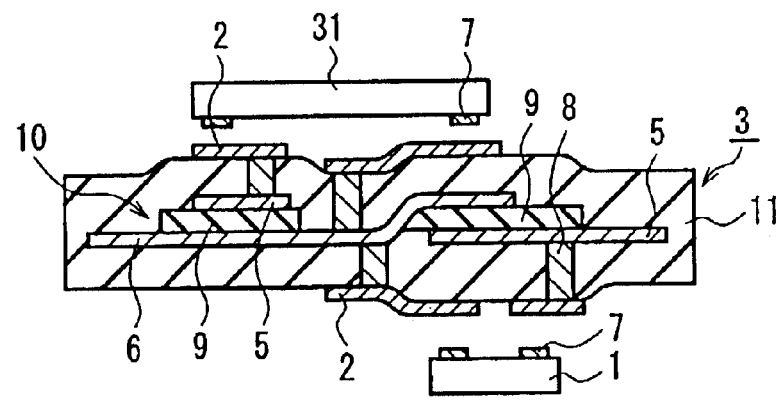
FIG. 14D
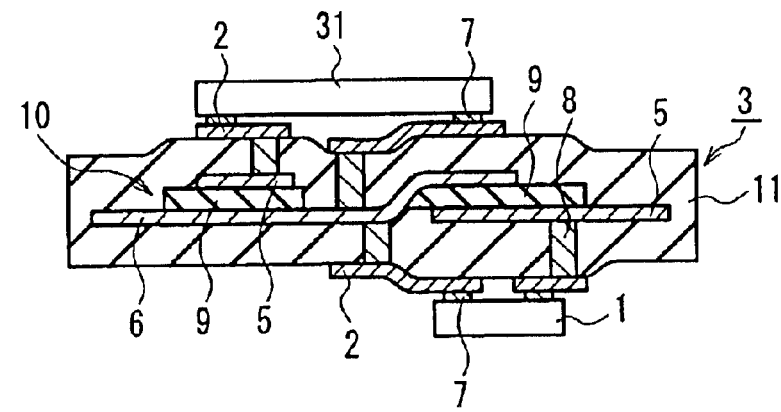

OPTICAL MODULE

FIELD OF THE INVENTION

The present invention relates to optical modules for sending and receiving optical signals that have excellent high frequency properties.

BACKGROUND OF THE INVENTION

In recent years, optical fiber communication, which is capable of transmitting large volumes of information with little loss, has been practiced as an alternative to communications employing metallic cable or wireless media.

When video signals are received over an optical fiber, a light-receiving device serves as the light-receiving front end portion. Light-receiving devices are made of a light-receiving element such as a photodiode (PD) that receives optical signals and generates a small current corresponding to those signals, and an element that, once the small current that has been generated is converted into voltage, amplifies the signals up to a reception sensitivity required by a television receiver or the like that is connected at a later stage and demodulates them.

The frequency band of signals processed by such light-receiving devices for receiving video signals has become increasingly high in the case of CATV, for example, as the number of channels increases, and at present is approaching 1 GHz.

A conventional example of a device for optical communications having good high frequency properties in a system that employs optical fiber to distribute video signals for multiple channels is disclosed in JP 2001-345456A, and is a wideband light-receiving device in which a capacitive element with excellent low-distortion properties over a wide frequency band is provided internally in a substrate. In this wideband light-receiving device, semiconductor elements are flip-chip mounted onto a multilayer substrate in which a capacitive element is provided internally in order to reduce parasitic inductance, and as a result the semiconductor elements and the capacitive element can be connected very close to one another, thereby resulting in excellent high frequency properties.

However, the following problems occur if the capacitance of the capacitive element is increased in a conventional module for optical communications.

FIG. 22 is a cross-sectional view showing the configuration of a conventional module for optical communications. FIGS. 23A–B is a cross-sectional view showing the processes for manufacturing a separate conventional module for optical communications.

With the module for optical communications shown in FIG. 22, an optical element 201 and a semiconductor element 231 are flip-chip mounted to terminal electrodes 202 formed on the surface of a multilayer substrate 203 via bumps 207. Within the multilayer substrate 203, an upper electrode 205 and a lower electrode 206 sandwich a dielectric layer 209 and thereby form a capacitive element, and the upper electrode 205 and the lower electrode 206 are connected electrically to the terminal electrodes 202 through via holes 208. With such a configuration, the capacitive element can be formed inside the multilayer substrate 203 below the semiconductor element 231. Also, because the dielectric layer 209 is formed spanning the entire area of the multilayer substrate 203, there is no unevenness in the surface of the multilayer substrate 203, and the optical element 201 and the semiconductor element 231 can be stably flip-chip-mounted onto the multilayer substrate 203.

To increase the capacitance of the capacitive element, the dielectric layer 209 can be formed using a material with a high relative permittivity, but because the dielectric layer 209 spans a wide area, there is the problem that stray capacitance may occur at unnecessary areas and that crosstalk may occur in the internal wiring layer.

Accordingly, as disclosed in JP H06-164150A, for example, the dielectric film 209 can be formed in one region only and not formed over a wide area. With the module for optical communications shown in FIGS. 23A–B, the dielectric layer 209 is formed in one region using a material that differs from that of the multilayer substrate 203, and thus the capacitive element is formed only at necessary areas, and the semiconductor element 231 and the capacitive element are connected at a very close distance to one another.

With this configuration, however, unevenness results in the surface of the multilayer substrate 203 at areas where the dielectric layer 209 has not been formed because there are areas within the multilayer substrate 203 where the dielectric layer 209 has been formed. For that reason, if the semiconductor element 231 is flip-chip mounted onto the multilayer substrate 203 from the state shown in FIG. 23A, a gap occurs between the bump 207 of the semiconductor element 231 and the terminal electrodes 202 as shown in FIG. 23B, and thus the semiconductor element 231 cannot be stably flip-chip mounted.

Moreover, as shown in FIG. 24, unevenness in the surface makes it impossible to mount the optical element 201 at a predetermined location of the multilayer substrate 203 and position an optical fiber 230 by passive alignment in a predetermined location using a V-groove 271. That is, the height difference that occurs between the terminal electrodes 202a and 202b causes the optical element 201 to be tilted when flip-chip mounted. As a consequence the direction in which the laser is emitted diverges from the predetermined direction and optical coupling with the optical fiber 230, which is arranged in a predetermined position, cannot be obtained. It should be noted that the V-groove 271 is formed in a bench 261 and the optical module is mounted onto the bench 261 via a connection terminal 251.

More specifically, a vertical disparity of about 10 μm occurs between the terminal electrode 202a and the terminal electrode 202b. For example, if the spacing between the bump 207a and the bump 207b in the direction of the optical axis is 200 μm and the vertical disparity between the terminal electrode 202a and the terminal electrode 202b is 20 μm, then an emission direction 241 of the optical element 201 is tilted with respect to an optical axis 242 of the optical fiber 230 by 5.7 degrees.

Light that is incident within 5.7 degrees of the optical axis 245 into an ordinary single-mode optical fiber 230 with a numerical aperture of 0.1 can be coupled. However, the light emitted from the optical element 201, which is a laser element, has a flare angle of a certain degree and its optical strength is in a Gaussian distribution with respect to the emission axis. Thus, a laser element that has a full width at half maximum of 15 degrees or more cannot be optically coupled with the optical fiber 230.

SUMMARY OF THE INVENTION

The present invention was arrived at in light of the foregoing problems, and it is an object thereof to provide an optical module that has good high frequency properties, in which an optical element and a semiconductor element, for example, are mounted stably onto a multilayer substrate.

An optical module of the present invention is provided with a substrate that includes an insulating layer, a passive element provided inside or on a surface of the insulating layer, and terminal electrodes formed on the surface of the insulating layer, and with at least one active element, which includes at least an optical element and is connected to the terminal electrodes on the substrate surface. The passive element has a dielectric layer, a resistive layer, or a magnetic layer, at least one of the terminal electrodes is connected to the passive element, and at least one of the at least one active element has a protruding electrode and is flip-chip mounted to the terminal electrodes on a principle face of the substrate via the protruding electrode. Taking a plane parallel to the principle face of the substrate as a projection plane, an area of orthographic projection of the dielectric layer, the resistive layer, or the magnetic layer is smaller than an area of orthographic projection of the principle face of the substrate, and the dielectric layer, the resistive layer, or the magnetic layer is formed such that the orthographic projection, with respect to the projection plane, of all the protruding electrodes of the at least one active element that is flip-chip mounted to the principle face of the substrate is included in the orthographic projection of the dielectric layer, the resistive layer, or the magnetic layer. It should be noted that a principle face is a surface of the substrate and represents the widest surface thereof.

Thus, unevenness can be prevented in areas where the protruding electrodes of the terminal electrodes are connected. For that reason, active elements can be stably flip-chip mounted onto the substrate. Also, the active elements formed on the primary face of the substrate and the passive element inside the substrate can be connected at a close distance, so that parasitic inductance can be reduced and the high frequency properties are excellent. In particular, in the frequency properties when light signals that are incident on or emitted from the optical element are converted into electrical signals, the cutoff frequency at which the conversion gain is halved is increased in frequency and thus the band can be widened.

Further, the at least one active element that has been flip-chip mounted can be present on only one principle face of the substrate.

Further, the at least one passive element that has been flip-chip mounted can be present on both principle faces of the substrate.

Further, the optical element further can include terminal electrodes on an end face of the substrate and an active element flip-chip mounted to these terminal electrodes.

Further, it is preferable that the total of a distance between the surface of the dielectric layer, the resistive layer, or the magnetic layer and a center of a region of contact between the protruding electrode of the optical element that has been flip-chip mounted to the principle face of the substrate and the terminal electrode, and a distance from a point where a perpendicular line passing through the center of the region of contact between the protruding electrode and the terminal electrode intersects with the surface of the dielectric layer, the resistive layer, or the magnetic layer to the end portion of the dielectric layer, the resistive layer, or the magnetic layer that is farthest from that point, is less than a distance corresponding to ½ the wavelength of the electrical signals that are processed by the optical element. Thus, the capacitive element that is formed by the dielectric layer, the resistive layer, or the magnetic layer can be kept from becoming inoperable.

Furthermore, it is preferable that the dielectric layer, the resistive layer, or the magnetic layer is formed independently at one or at each of a plurality of the terminal electrodes that are formed on the principle face of the substrate. Thus, the dielectric layer, the resistive layer, or the magnetic layer can be reduced in size, which allows costs to be reduced.

Further, the at least one active element includes a semiconductor element.

In addition, it is preferable that a region where the dielectric layer, the resistive layer, or the magnetic layer has not been formed is present in the region where the orthographic projection with respect to the projection plane of all the protruding electrodes of the semiconductor element that is arranged onto the principle face of the substrate is not formed. Thus, the degree of freedom for the wiring between the terminal electrodes for the semiconductor element on the substrate surface and the passive element that is internally provided in the substrate can be increased.

Further, it is preferable that a via conductor is formed in a region where the dielectric layer, the resistive layer, or the magnetic layer has not been formed. Thus, the via conductor is formed by a material with a high thermal conductivity and is arranged directly below the semiconductor element, so that heat from the semiconductor element can be dissipated efficiently.

Further, it is preferable that the passive element includes a pair of passive element electrodes formed sandwiching the dielectric layer, the resistive layer, or the magnetic layer, and that the pair passive element electrodes are formed perpendicular to the terminal electrodes and are separated into a plurality of units in the surface. Thus, a different voltage can be set for each terminal of the active element, and a bypass capacitor of any capacitance can be provided at each terminal, so that the high frequency properties of the semiconductor element can be improved even further.

Also it is preferable that the optical module further includes an optical waveguide for guiding light and a bench that has a groove for securing the optical waveguide. Thus, light can be transferred through the optical waveguide, and moreover, the optical waveguide and the optical element can be aligned easily with one another.

Further, the groove can secure the optical waveguide so that an optical axis of the optical waveguide is substantially parallel to a principle face of the substrate.

Alternatively, the groove can fasten the optical waveguide so that an optical axis of the optical waveguide is substantially perpendicular to a principle face of the substrate.

It is further preferable that the optical module further includes an optical waveguide for guiding light and a groove for securing the optical waveguide, and that the groove is formed on the substrate and fastens the optical waveguide so that an optical axis of the optical waveguide is substantially parallel to the principle face of the substrate. Thus, it is not necessary to prepare a bench, and thus costs can be reduced.

Furthermore, the dielectric layer, the resistive layer, or the magnetic layer can be formed on the surface of the substrate.

It is further preferable that the at least one active element includes an optical element and a semiconductor element, that the optical element is flip-chip mounted to the terminal electrodes on one principle face of the substrate, and that the semiconductor element is flip-chip mounted to the terminal electrodes on the other principle face of the substrate. Thus, the optical coupling portion of the optical element and the heat dissipation portion of the semiconductor element are spatially separated from one another, and thus the heat dissipation efficiency is good.

It is furthermore preferable that a mixture including an inorganic filler and a thermosetting resin composition is packed around the semiconductor element. Thus, heat conductivity and the heat dissipation efficiency are high.

In addition, the inorganic filler can include at least one of alumina, aluminum nitride, silicon nitride, beryllia (BeO), and silica.

Also, plural passive elements can be formed.

Furthermore, the optical element can be a light-receiving element or a light-emitting element.

Further, the optical element can be a light-receiving element, and the semiconductor element can be an amplifier element for amplifying signals of the light-receiving element.

Further, it is preferable that the light-receiving element is a rear face-illuminated photodiode, and that the semiconductor element is a transimpedance-type wideband amplifier.

Additionally, it is preferable that the optical element is a light-emitting element, and that the semiconductor element is a drive element for driving the light-emitting element.

Also, it is preferable that the light-emitting element is an end face-emitting laser diode or a surface-emitting laser diode, and that the semiconductor element is a laser drive element.

It is further preferable that the insulating layer of the substrate is a low sintering temperature glass ceramic with an inorganic sintered material as a primary component, and that the dielectric layer of the passive element includes a lead-based perovskite compound as a primary component.

In a further preferable aspect, the insulating layer of the substrate is a low sintering temperature glass ceramic with an inorganic sintered material as a primary component, and the resistive layer of the passive element includes $RuO_2$ as a primary component.

It is further preferable that the at least one active element includes an optical element and a semiconductor element, that the optical element is flip-chip mounted to the terminal electrodes that are formed on an end face of the substrate, and that the semiconductor element is flip-chip mounted to the terminal electrodes that are formed on the principle face of the substrate. Thus, the optical element and the passive element in the substrate can be connected near one another, so that there are excellent high frequency properties and the optical fiber and the optical element in the optical module can be optically coupled with ease.

BRIEF DESCRIPTION OF THE DRAWINGS

FIG. 2A is a diagram of a first step and FIG. 2B is a diagram of a second step.

FIG. 3A is a cross-sectional view and FIG. 3B is a plan view.

FIGS. 14A–D shows cross-sectional views of the steps for manufacturing the optical module according to Embodiment 5 of the present invention, where FIG. 14A is a diagram of a first step, FIG. 14B is a diagram of a second step, FIG. 14C is a diagram of a third step, and FIG. 14D is a diagram of a fourth step.

FIG. 16A is a plan view and FIG. 16B is a cross-sectional view taken along the line B-B' of FIG. 16A.

FIG. 23A is a diagram of a first step and FIG. 23B is a diagram of a second step.

DESCRIPTION OF THE PREFERRED EMBODIMENTS

Embodiment 1

Figure 1:
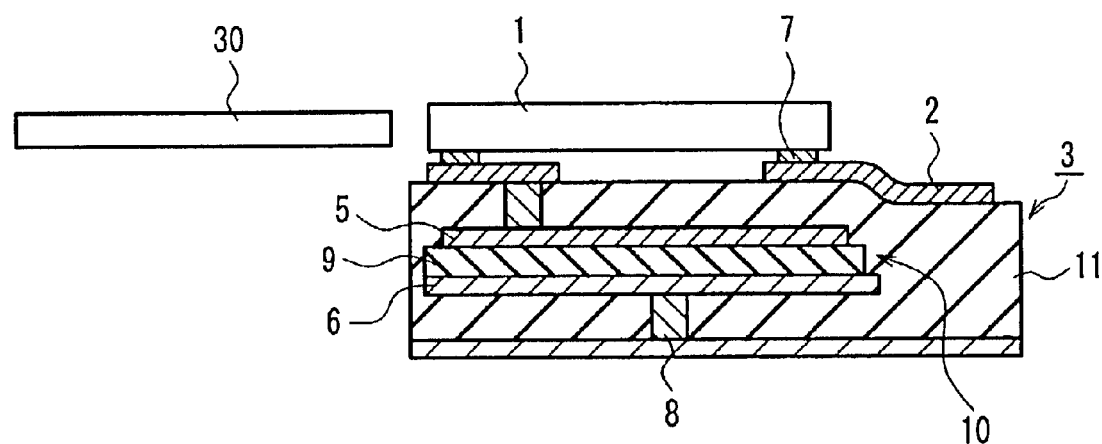
FIG. 1 is a cross-sectional view showing the configuration of an optical module according to Embodiment 1 of the present invention.

An optical module according to Embodiment 1 of the present invention is described with reference to the drawings. FIG. 1 is a cross-sectional view of this optical module.

As shown in FIG. 1, the optical module according to Embodiment 1 has an optical element 1 arranged on the surface of a multilayer substrate 3 in which a passive element 10 has been provided internally. The passive element 10 includes a first passive element electrode 5 and a second passive element electrode 6 sandwiching a passive element dielectric material 9 from above and below. The passive element dielectric material 9 is made of a material that differs from the insulating material making up an insulating layer 11 of the multilayer substrate 3. It should be noted that the multilayer substrate 3 includes the passive element 10 and via conductors 8 within the insulating layer 11, and that terminal electrodes 2 are formed on the surface of the insulating layer 11. The insulating layer 11 is for example a low sintering temperature glass ceramic that includes a sintered inorganic material as a primary component.

If the optical element 1 is an end face-illuminated photodiode or an end face-emitting laser diode, then an optical fiber 30 is disposed on the end face side of the optical element 1 and the optical element 1 and the optical fiber 30 are optically coupled. If the optical element 1 is a top face or a rear face-illuminated photodiode or a surface-emitting laser diode, then, although not shown, the optical fiber 30 is disposed above the upper surface of the optical element 30 and the optical element 1 and the optical fiber 30 are optically coupled.

The optical element 1 is flip-chip connected to the terminal electrodes 2 that are formed on the surface of the multilayer substrate 3 via bumps 7 as protruding electrodes. The passive element 10 is connected to the optical element 1 via the via conductors 8 and the terminal electrodes 2. If a projection plane is parallel to the surface of the multilayer substrate 3, then the area of the orthographic projection of the passive element dielectric material 9 is smaller than the area of the orthographic projection of the surface of the multilayer substrate 3, and the passive element dielectric material 9 is formed so that the orthographic projection with respect to the projection plane of all the bumps 7 of the optical element 1 that has been flip-chip mounted to the surface of the multilayer substrate 3 is included in the orthographic projection of the passive element dielectric material 9. That is, the passive element dielectric material 9 is formed at least in the regions that are vertically below all the bumps 7 of the optical element 1, and is formed partially, that is, without spreading over the entire area of the multilayer substrate 3.

Thus, there is little unevenness in the surface of the multilayer substrate 3 at the regions where the passive element dielectric material 9 has been formed, and therefore the unevenness in the surface of the multilayer substrate 3 at the regions where the bumps 7 of the optical element 1 are formed is small. Consequently, there is little height difference between the spots where the bumps 7 that are connected to the terminal electrodes 2 are formed, and thus the optical element 1 can be connected stably to the terminal electrodes 2. Also, the high frequency properties of the passive element 10 are favorable.

Figure 3A:
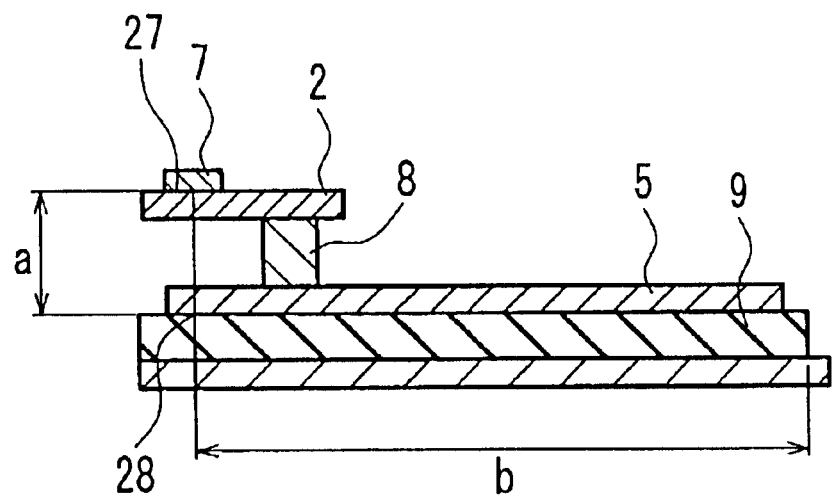
FIGS. 3A–B is a diagram showing the arrangement of the passive element dielectric material in the optical module according to Embodiment 1 of the present invention, where
Figure 3B:
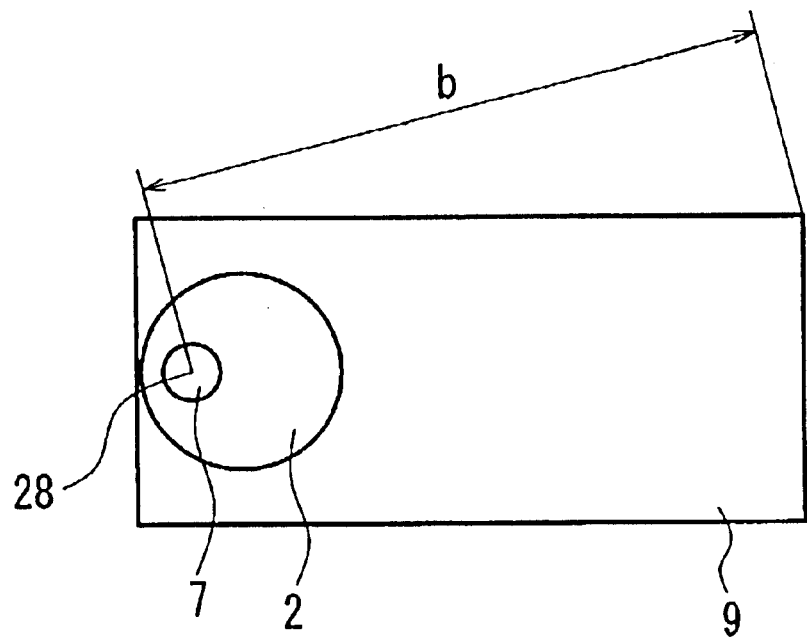

Moreover, as shown in FIGS. 3A and 3B, it is preferable that the total of a distance a between the center of the region of contact between the terminal electrode 2 and the bump 7 and the passive element dielectric material 9 and a distance b from the spot at which a perpendicular line from the center of the region of contact between the terminal electrode 2 and the bump 7 crosses the passive element dielectric material 9 to the farthest end portion of the passive element dielectric material 9 from that spot is smaller than the distance corresponding to ½ the wavelength of the electrical signals that are processed by the optical element 1. The distance a is the distance from the center of a region 27 of the bump 7 that is in contact with the terminal electrode 2 to the passive element dielectric material 9. The distance b is the distance from a point 28 where the perpendicular line from the center of the region 27 comes into contact with the passive element dielectric material 9 to the end portion of the passive element dielectric material 9 that is farthest from this point. If the total of distance a and distance b, that is, a+b, is more than ½ the wavelength of the electrical signals that are processed by the optical element 1, then the passive element 10 can no longer function as a capacitive element. Consequently, to allow the passive element 10 to function as a capacitive element, it is preferable that the distance a+b is less than ½ the wavelength of the electrical signals. It should be noted that if the distance a+b is less than ½ but more than ¼ the wavelength of the electrical signals, then the passive element may be inductive, but if the distance a+b is less than ¼ the wavelength of the electrical signals that are processed by the optical element 1, then the passive element necessarily becomes capacitive.

It is possible to obtain ½ the wavelength of the electrical signals by dividing the speed of the electrical signals ($3 \times 10^{11}$(mm/sec)) by the square root of the relative permittivity, dividing the result by the frequency, and then dividing this by 2. For example, if the optical element 1 processes ten gigabits of electrical signals per second, then the highest frequency of the signals is 5 GHz. If the insulating layer 11 of the multilayer substrate 3 is a glass-ceramic composite material with a relative permittivity of 7, then ½ the wavelength of the electrical signals is 11.3 mm. Consequently, the distance a+b is preferably less than 11.3 mm. It should be noted that the frequency of the electrical signals includes components that are not 5 GHz, and thus the frequency of the signals of the base processing speed preferably is used as a reference.

The various parts will be explained in further detail below. For the passive element dielectric material 9, a material with a higher relative permittivity than the relative permittivity of the insulating layer 11 of the multilayer substrate 3 is used.

As a dielectric material with a large relative permittivity, a composite perovskite compound material including lead or a barium titanate-based material can be used. Here, it is preferable that a composite perovskite compound material including lead is used because it has a particularly high relative permittivity and a relatively low sintering temperature. A lead-based composite perovskite compound includes compounds represented by $Pb(B1B2)O_3$ and combinations of these compounds. Here, B1 is Co, Mg, Mn, or Ni, and B2 is Nb, Ta, or W. Examples of lead-based composite perovskite compounds include $Pb(Mg_{1/3}Nb_{2/3})O_3$—$Pb(Ni_{1/2}W_{1/2})O_3$— and $PbTiO_3$. There are no particular limitations to the thickness of the passive element dielectric material 9, although normally it is about 5 to 50 $\mu$m.

For the insulating layer 11 of the multilayer substrate 3 it is possible to use a ceramic material such as alumina or a glass-ceramic composite material, for example. It is particularly preferable that a glass-ceramic composite material is used, because of its low sintering temperature and the fact that it can use a metal with a low melting point, such as copper or silver, as a conductor. The glass component of the glass-ceramic composite material can be for example a crystalline glass such as borosilicate glass and borosilicate glass containing lead oxide, zinc oxide, an alkali metal oxide, or an alkaline earth metal oxide, for example. It should be noted that the composition ratio of components in the glass-ceramic composite material can be adjusted suitably, taking into account the sintering temperature, the relative permittivity, and the mechanical strength, for example, of the composite material. There are no particular limitations to the thickness of the insulating layer 11, and it is normally about 30 to 300 μm.

For the optical element 1, a light-receiving element such as a photodiode can be used. It is particularly preferable to use a PIN photodiode or an avalanche photodiode that can operate in a high frequency range. If a light-receiving element is used as the optical element 1, then the terminal for applying voltage to the light-receiving element must be grounded at a high frequency, and thus it is preferable that a capacitive element is adopted as the passive element 10 that is provided internally in the multilayer substrate 3. In this case, parasitic inductance associated with the voltage applying terminal can be reduced. Thus, the terminal for applying voltage to the light-receiving element is ideally in a grounded state in high frequency bands, so that the frequencies where the gain for converting light signals received by the light-receiving element to electrical signals is halved can be increased.

Figure 2A:
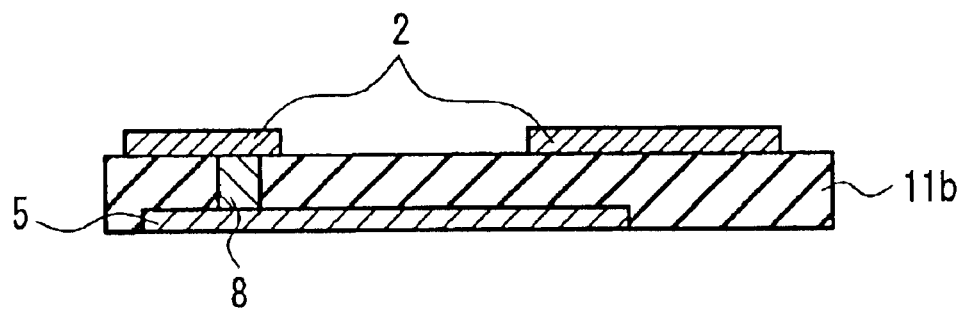
FIGS. 2A–B is a cross-sectional view showing the steps for manufacturing the optical module according to Embodiment 1 of the present invention, where
Figure 2A:
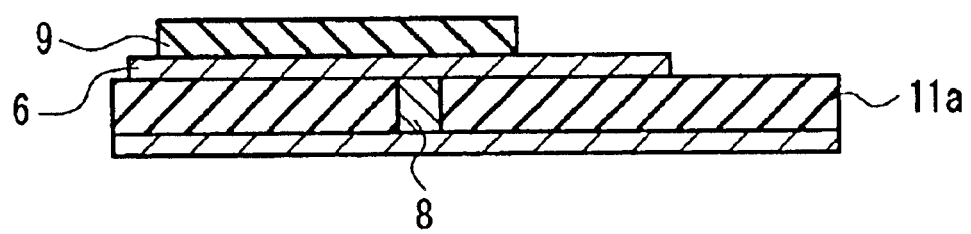
Figure 2B:
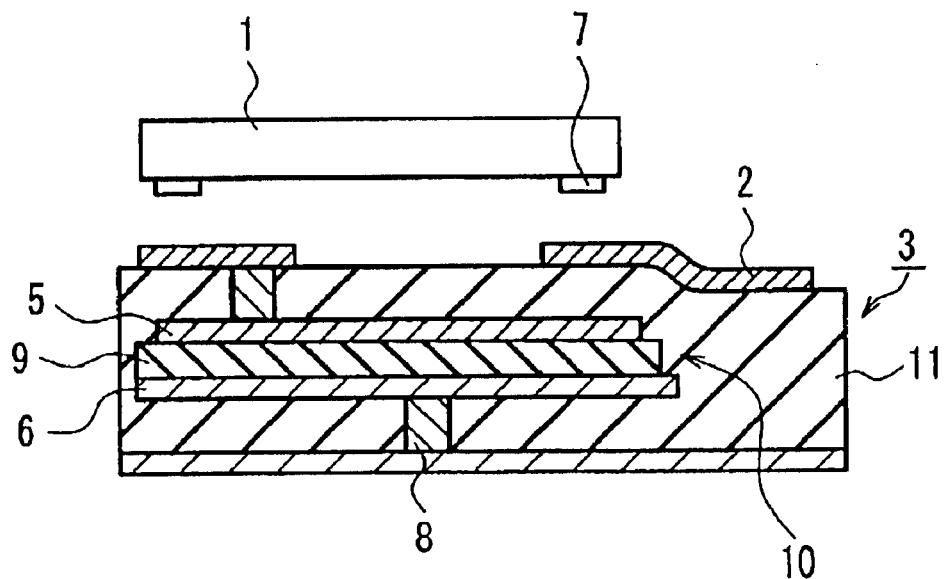

Next, a method for manufacturing the optical module of Embodiment 1 is described using FIGS. 2A–B, which is a cross-sectional view showing the steps for manufacturing the optical module. As shown in FIG. 2A, the insulating layer 11 is formed by layering a first sheet-shaped insulator 11a and a second sheet-shaped insulator 11b. A second passive element electrode 6 is formed on at least one side of the first sheet-shaped insulator 11a, and in order to form a capacitive element, a layer of the passive element dielectric material 9 is formed. The passive element dielectric material 9 is formed by fabricating a slurry in which an organic binder is mixed with the raw material powder of a lead-based perovskite compound using a ball mill or a common three-roller kneader, for example, and then patterning the slurry onto the sheet-shaped insulator Ha on which the second passive element electrode 6 has been formed using a printing technique.

On the other hand, the second sheet-shaped insulator lib is for example a green sheet (MLS-1000 made by Nippon Electric Glass Co., Ltd., 220 μm thick) made of a low sintering temperature substrate material that includes glass and alumina as primary components. To form the via conductors 8, a puncher is used to punch 0.2 mmø holes in the insulator 11b and thereby form through holes, into which is filled a conductive paste with silver powder as its primary component by printing. Then, a wiring pattern including the terminal electrodes 2 is formed on one surface of the insulator 11b and the first passive element electrode 5 is formed on the other surface of the insulator 11b in the same fashion by printing with a conductive paste.

The multilayer substrate 3 is fabricated by laminating the second sheet-shaped insulator 11b at a temperature of 70° C. and a pressure of 4.9 MPa, for example, so as to sandwich the passive element dielectric material 9 of the first sheet-shaped insulator 11a between the first and second passive element electrodes 5 and 6, and then sintering at 850° C. to 950° C. under set conditions for a period of 0.1 to 10 hours. It should be noted that the via conductors 8 also can be formed in the first sheet-shaped insulator 11a if necessary.

The following method is an example of a method for flip-chip mounting the optical element onto the multilayer substrate 3 in which the passive element 10 has been provided internally. As shown in FIG. 2B, protruding electrodes made of Au, for example, serving as bumps 7 are formed onto the terminal electrodes of the optical element 1 by wire bonding or plating and positioned so that the terminal electrodes 2 of the multilayer layer substrate 3 and the bumps 7 come into contact, and the optical element 1 and the multilayer substrate 3 are electrically connected by pressure and ultrasonic waves.

In another mounting method, the bumps 7 of the optical element 1 can be connected to the terminal electrodes 2 via a conductive adhesive agent in which flake-shaped particles of gold, silver, or a silver-palladium alloy have been diffused throughout the resin. In this case, after the conductive adhesive agent has been transferred to the bumps 7, alignment is carried out so that the conductive adhesive agent is in contact with the terminal electrodes 2 of the multilayer substrate 3, and then the conductive adhesive agent is cured to achieve an electrical connection between the optical element 1 and the multilayer substrate 3. The bumps 7 can be electrodes formed by a solder that is not a precious metal, and the melting of the solder due to thermal processing also may be utilized.

A conductive adhesive can be used in conjunction with the formation of the protruding electrode bumps 7 made of solder. With such a method, if there are discrepancies in the height of the bumps 7, then the conductive adhesive acts as a buffer that absorbs the discrepancies in distance between the bumps 7 and the terminal electrodes 2 and enables stable mounting, even if there are terminals on which low bumps 7 have been formed. In general, the thickness of the conductive adhesive is about 10 μm, and therefore connection can be accomplished stably without connection defects if the height discrepancy among the bumps 7 is less than 10 μm. However, if the unevenness in the surface of the multilayer substrate 3 is more than 10 μm, then it is difficult to achieve a stable connection.

Also, to reinforce the connection between the optical element 1 and the terminal electrodes 2, a liquid resin composition can be applied and cured to seal the gap formed between the optical element 1 and the multilayer substrate 3. This resin composition may include an epoxy-based resin and filler such as silica, and the filler is dispersed uniformly throughout the resin composition.

Figure 4:
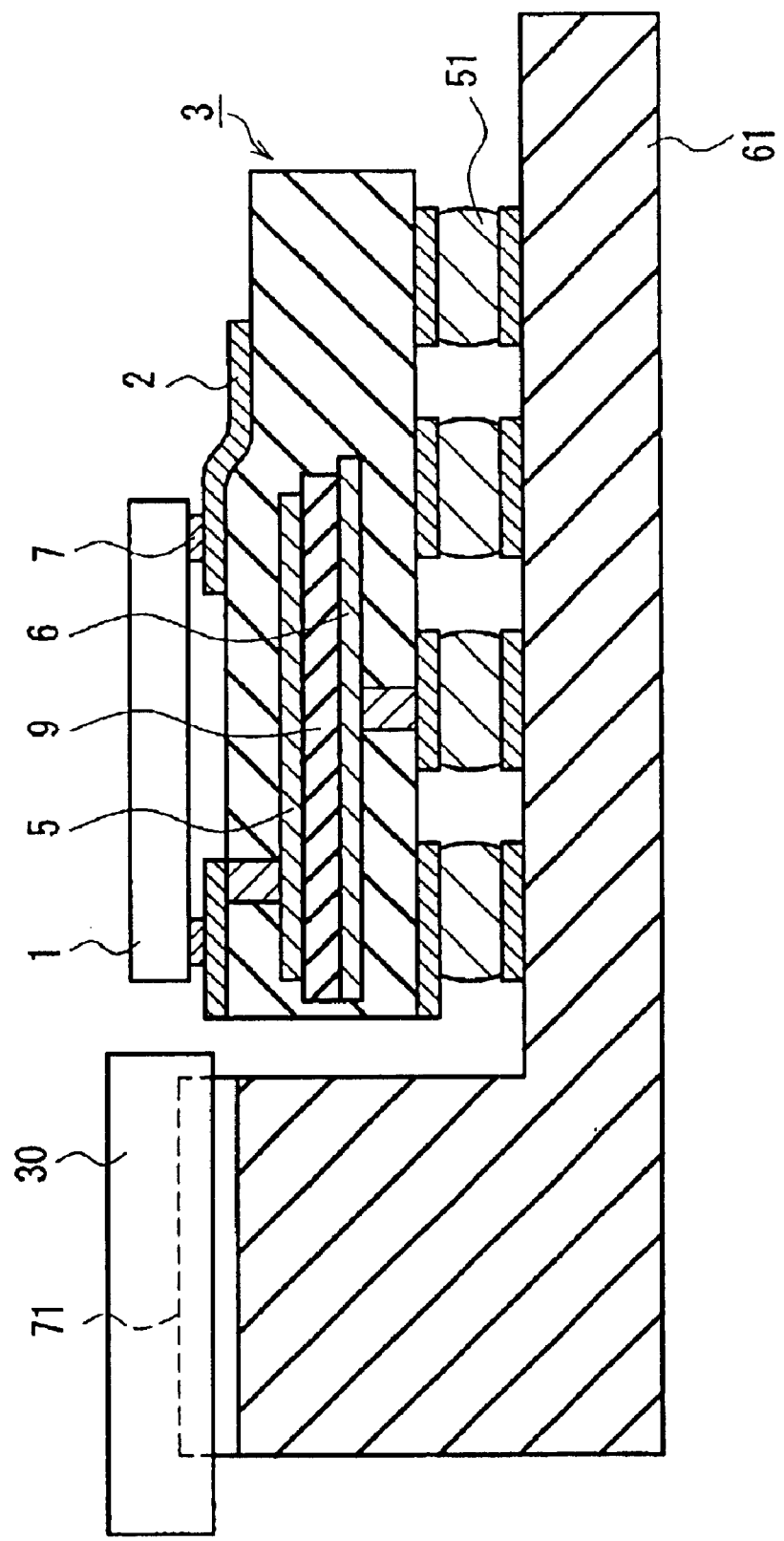
FIG. 4 is a cross-sectional view of a packaged unit including the optical module according to Embodiment 1 of the present invention.

Next, the process of aligning the optical fiber 30 and the optical element 1 will be explained. In order to align the optical fiber 30 and the optical element 1, a passive alignment technique can be used to position the two in predetermined locations using alignment marks or the like. FIG. 4 is a cross-sectional view of a packaged unit including the optical module according to Embodiment 1. The optical module shown in FIG. 1 is mounted to a bench 61 on which an optical fiber fastening groove 71 has been provided, via a connection terminal 51. The optical fiber 30 is fit into and held securely in the optical fiber fastening groove 71.

For example, with a land grid array or a ball grid array in which solder or a conductive resin or the like is used, a plurality of connection terminals 51 can be connected at the same time by applying heat, for example. In this case, a plurality of alignment marks are provided on the bench 61 and the multilayer substrate 3 before alignment is carried out. The optical fiber and the optical element 1 are optically coupled, in particular, the angle of rotation of the multilayer substrate 3 is adjusted in a direction of rotation about a rotational axis that is perpendicular to the upper surface of the bench 61 on which the connector terminals 51 have been disposed.

By arranging the optical fiber 30 into the optical fiber fastening groove 71, the optical fiber 30 is secured in a fixed position. Consequently, by taking into account the positions of the optical element 1 and the optical fiber 30 when designing, the optical element 1 that is mounted and the optical fiber 30 can be optically coupled simply by arranging the optical fiber 30 in the optical fiber fastening groove 71, and thus the two are easily aligned and manufacturing can be carried out with a high yield.

As explained in the foregoing, the optical element 1 is stably mounted onto the multilayer substrate 3, and thus the direction of the optical axis of the optical element 1 does not deviate from the predetermined direction. Also, by detecting the location of the alignment markings provided on the optical element 1 and the location of the alignment markings provided on the bench 61 and adjusting the relative positions of the two, the optical element 1 and the bench 61 can be set in a predetermined arrangement. As a result, the optical element 1 and the optical fiber 30 can be optically coupled with high precision. Thus, an optical module having the optical element 1 and the optical fiber 30 optically coupled with high precision can be manufactured stably and with ease.

If the optical element 1 is mounted onto the multilayer substrate 3, then the optical element 1 can be mounted in a predetermined position by providing alignment marks on the optical element 1 and the multilayer substrate 3. For example, alignment marks provided on the multilayer substrate 3 side cannot be identified using ordinary lighting but can be identified using infrared light transmitted by the optical element 1.

Also, by providing alignment marks on the end face of the optical fiber 30 and adjusting these with respect to the alignment marks that have been provided on the optical element 1, the optical element 1 can be mounted at a predetermined location.

Figure 5:
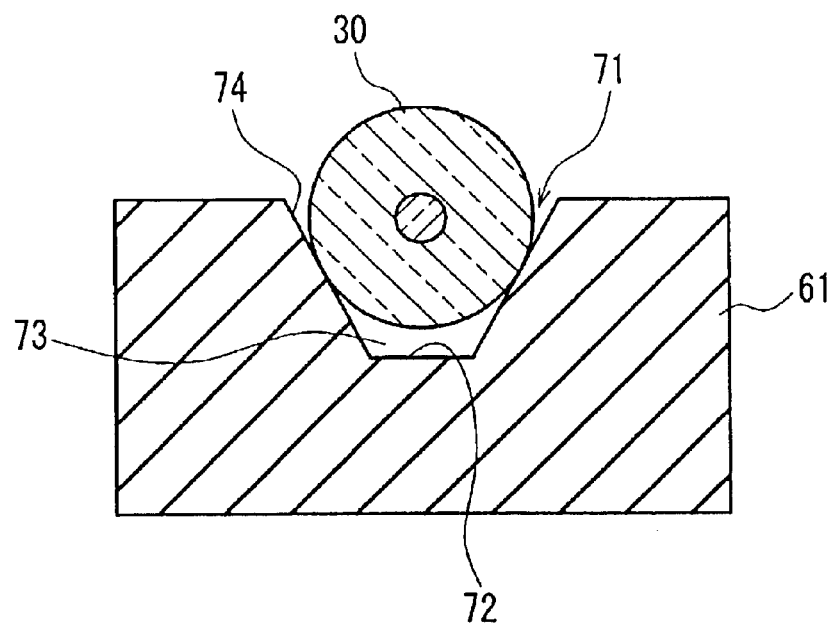
FIG. 5 is a cross-sectional view of the optical fiber fastening groove according to Embodiment 1 of the present invention.

The bench 61 can be made of silicon, for example, and a substantially V-shaped optical fiber securing groove 71 can be formed by etching the bench 61, for example. FIG. 5 is a cross-sectional view showing the shape of the optical fiber fastening groove. As shown in FIG. 5, the cross section of the optical fiber fastening groove 71 also may be trapezoidal with a progressively narrowes width approaching the bottom instead of V-shaped. By giving it a trapezoidal shape, the distance between a bottom surface portion 72 of the optical fiber securing groove 71 and the optical fiber 30 when the optical fiber 30 is fastened in the optical fiber securing groove 71 is shorter than if the groove is V-shaped, and the volume of a space 73 enclosed by the optical fiber securing groove 71 and the optical fiber 30 is also smaller. Thus, when the optical fiber 30 is fastened in the optical fiber securing groove 71 using an adhesive agent, the optical fiber 30 can be stably secured with a small amount of adhesive. Although it is preferable that the optical fiber 30 and side surface portions 74 of the optical fiber securing groove 71 are in contact because this increases stability, adequate stability may be also obtained by inserting an adhesive agent between them.

Figure 6:
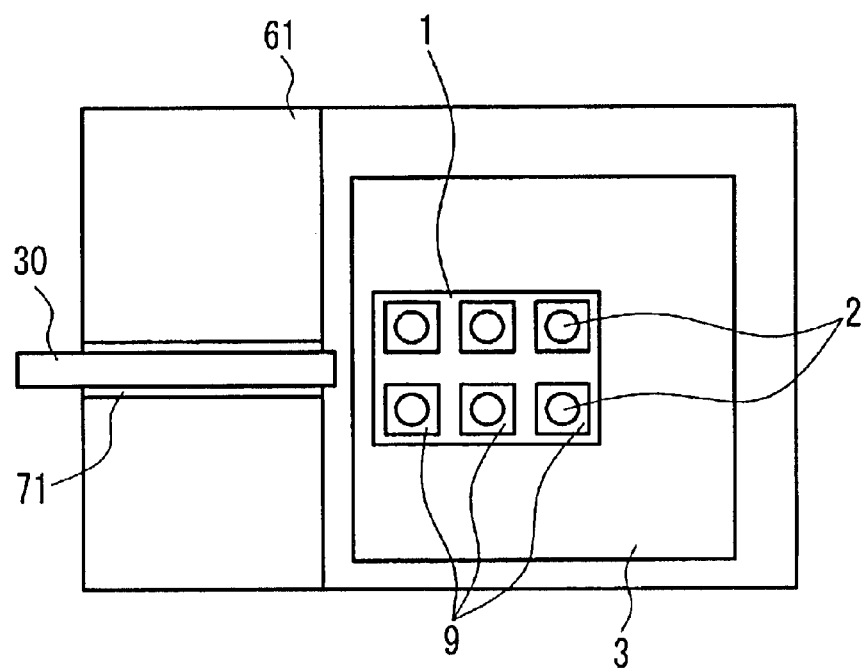
FIG. 6 is a plan view showing the passive element dielectric material divided in the optical module according to Embodiment 1 of the present invention.

FIG. 6 is a plan view of a packaged unit that includes the optical module according to Embodiment 1. It should be noted that in FIG. 6 the first passive element electrode 5 has been omitted. As shown in the drawing, the passive element dielectric material 9 is not a single unit but instead divided into separate units, and it is preferable that there is an equal number of passive element dielectric material 9 units and terminal electrodes 2 and that the terminal electrodes 2 are connected to the passive element dielectric material 9 units.

By doing this, the passive element dielectric material 9 can be reduced in size and high-frequency properties can be improved. It should be noted that the number of passive element dielectric material 9 units is at most the same as the number of terminal electrodes 2, and also may be less than this number. The passive element dielectric material 9 should be connected to at least one terminal electrode 2. Also in this case, it is preferable that the distance a+b is less than ½ the wavelength of the electrical signals, as explained above.

Figure 7:
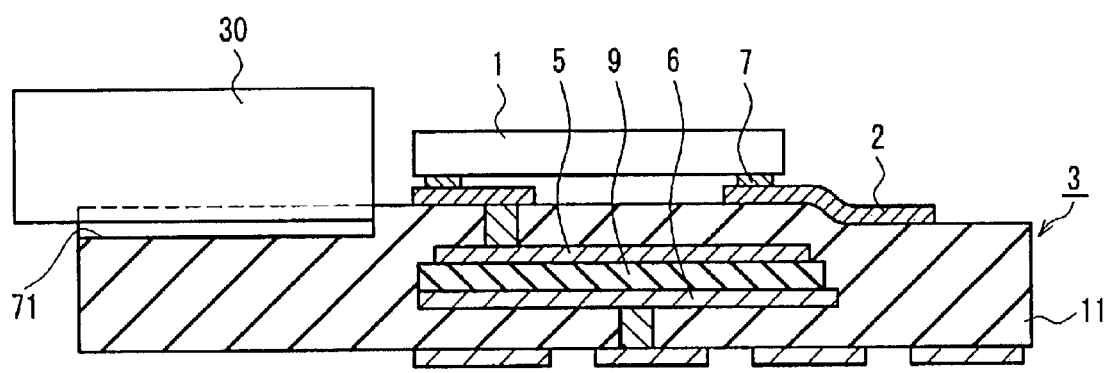
FIG. 7 is a cross-sectional view of another optical module according to Embodiment 1 of the present invention.

As shown in FIG. 7, it is possible to form the optical fiber securing groove 71 directly in the multilayer substrate 3 and fasten the optical fiber 30 therein without using the bench 61 on which the optical fiber fastening groove 71 has been formed. In this case, a portion corresponding to the optical fiber securing groove 71 can be formed by press molding, for example, using a protrusion-shaped mold while the insulating layer 11 is still in the green sheet stage, or the optical fiber securing groove 71 can be formed by press molding after laminating and then sintering the multilayer substrate 3.

For example, a groove provided in the multilayer substrate 3 can serve not only as the optical fiber securing grove 71 but also as a groove for forming an optical waveguide, in which case an optical waveguide is formed in the groove instead of the optical fiber 30 and the optical waveguide and the optical element 1 are coupled.

As described above, according to the optical module of Embodiment 1, the passive element dielectric material 9 of the passive element 10 is at least formed in a region directly below the bumps 7 of the optical element 1 and is formed partially, that is, without spreading over the entire area of the multilayer substrate 3, and therefore unevenness does not occur in the surface of the multilayer substrate 3 on which the terminal electrodes 2 for flip-chip mounting the optical element 1 are formed. Thus, the optical element 1 can be stably flip-chip connected to the multilayer substrate 3, so that a passive alignment technique can be used and yield can be improved. In addition, the passive element 10 has good high-frequency properties.

Also, because the optical element 10, which serves as a capacitive element, is formed in contact with a portion directly below the terminal electrodes 2, a capacitive element is formed inside the multilayer substrate 3 at a short distance from the terminal electrodes 2. Thus, parasitic inductance can be reduced, and therefore the module has excellent high-frequency properties.

In particular, an optical module can be achieved with frequency properties during the conversion of optical signals incident on the optical element 1 or emitted from the optical element 1 to electrical signals in which the cutoff frequency where conversion gain is halved is increased to a higher frequency.

It should be noted that in Embodiment 1 a case in which the passive element 10 that is internally provided in the multilayer substrate 3 is a capacitive element was shown illustratively. However, there are no limitations to this, and for example, the passive element 10 that is internally provided may be an inductor or a resistor element. To make the internally provided passive element 10 into an inductor, an inductor easily can be achieved simply by using a magnetic material in place of the passive element dielectric material 9 and changing the position and the shape of the first and second passive element electrodes 5 and 6.

There are no particular limitations to the magnetic material, and a conventionally known magnetic material for an inductor can be chosen suitably taking into account sintering temperature, magnetic permeability, magnetic loss, and temperature characteristics, for example. Examples include spinel ferrites and garnet ferrites that are NiZnCu-based, NiZnbased, MnZn-based, or MgZn-based. In particular, NiZnCu-based spinel ferrites are beneficial because of their high electric resistance and relatively low sintering temperature. For the first and second passive element electrodes 5 and 6, the same material as that when the passive element 10 is a capacitive element can be used, and their shape may include linear, spiral, or meandering shapes, for example, to be selected corresponding to the application.

In addition, the optical element 1 was described as a light-receiving element, but it also can be a light-emitting element or modulating element, for example. Depending on the type of optical element 1, the position and the shape of the electrodes and the function of the internally provided passive element will differ. It is preferable that a light-emitting element is a laser diode, for example, and more preferably a laser diode in which an electric field absorption-type modulator that is capable of operating in a high frequency range has been installed.

Embodiment 2

Figure 8:
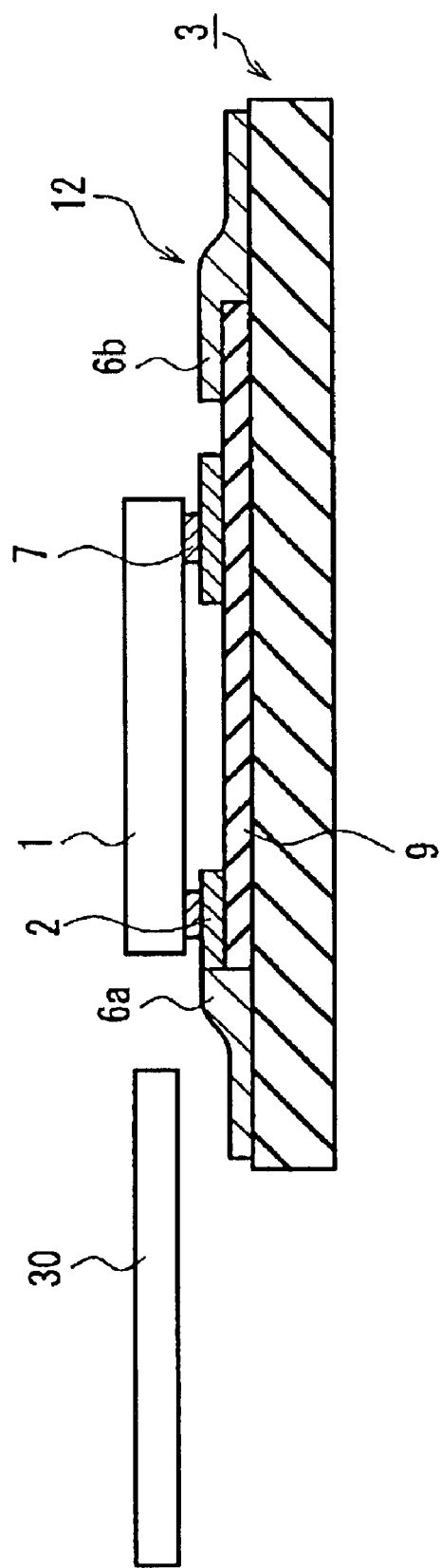
FIG. 8 is a cross-sectional view showing the configuration of the optical module according to Embodiment 2 of the present invention.

An optical module according to Embodiment 2 of the present invention is described using FIG. 8. FIG. 8 is a cross-sectional view of the optical module.

The optical module of Embodiment 2 has a structure in which a passive element 12 is formed on a portion of the surface of the multilayer substrate 3.

As shown in FIG. 8, the passive element 12 is formed on the surface of the multilayer substrate 3. The passive element 12 includes the terminal electrodes 2, second passive element electrodes 6a and 6b, and the passive element dielectric material 9. The terminal electrodes 2 are adhered to the top surface of the passive element dielectric material 9 that is formed on the multilayer substrate 3. The terminal electrodes 2 are electrodes connected to the optical element 1 via the bumps 7, but also function as the electrodes of the passive element 12, and thus serve as a substitute for the first passive element electrode 5 of Embodiment 1. The passive element dielectric material 9 is at least formed in regions that are vertically below the bumps 7 of the optical element 1 and is formed partially, that is, without spreading over the entire area of the multilayer substrate 3. Thus disparities in height do not occur between the terminal electrodes 2.

The second passive element electrodes 6a and 6b are formed on the multilayer substrate 3 so that they are connected to the end portions of the passive element dielectric material 9. Of these two electrodes, the second passive element electrode 6a and one of the terminal electrodes 2 are in direct contact. In addition, the second passive element electrode 6b, which is not connected to a terminal electrode 2, is formed covering at least a portion of the passive element dielectric material 9.

The optical element 1 is flip-chip connected to the terminal electrodes 2 via the bumps 7, and the optical fiber 30 is arranged so that it is optically coupled to the optical element 1.

The method for manufacturing the optical module according to Embodiment 2 is described next. On the multilayer substrate 3 with an insulating layer of alumina or a glass-ceramic composite material, a resistor paste including a glass component is applied to a predetermined region by a printing technique, for example, dried and then sintered to serve as the passive element dielectric material 9. The resistor paste is for example a ruthenium-based cermet resistor paste including $RuO_2$ as a primary component. Next, a conductive paste is applied to a predetermined region by a printing technique, for example, dried and then sintered in order to form the terminal electrodes 2 and the second passive element electrodes 6a and 6b so that they cover or overlap a portion of the passive element dielectric material 9. The conductive paste can include for example silver powder and a glass component.

Next, the optical element 1 is flip-chip mounted onto the multilayer substrate 3 on which the passive element 12 has been formed in the same manner as in Embodiment 1.

As described above, with the optical module of Embodiment 2, unevenness does not occur between the terminal electrodes 2, and thus the optical element 1 can be stably flip-chip connected to the multilayer substrate 3. Consequently, a high yield of optical modules can be obtained.

Also, the passive element 12 is formed as a resistor element in contact with the terminal electrodes 2, and thus the optical element 1 and the passive element 12 can be connected with even shorter wiring than in a case where the passive element 12 is provided inside the multilayer substrate 3. For that reason, parasitic capacitance between the optical element 1 and the passive element 12 can be reduced and excellent high frequency properties are attained. In particular, an optical module can be achieved with frequency properties during the conversion of optical signals emitted from the optical element 1 into electrical signals in which the cutoff frequency where conversion gain is halved is increased to a higher frequency.

More specifically, if a direct modulation-type laser diode is mounted to a ceramic substrate in which a resistor element with an internal resistance of 45 Ω is formed, then a cutoff frequency can be obtained with flat group delay frequency properties up to 13 GHz.

Figure 9:
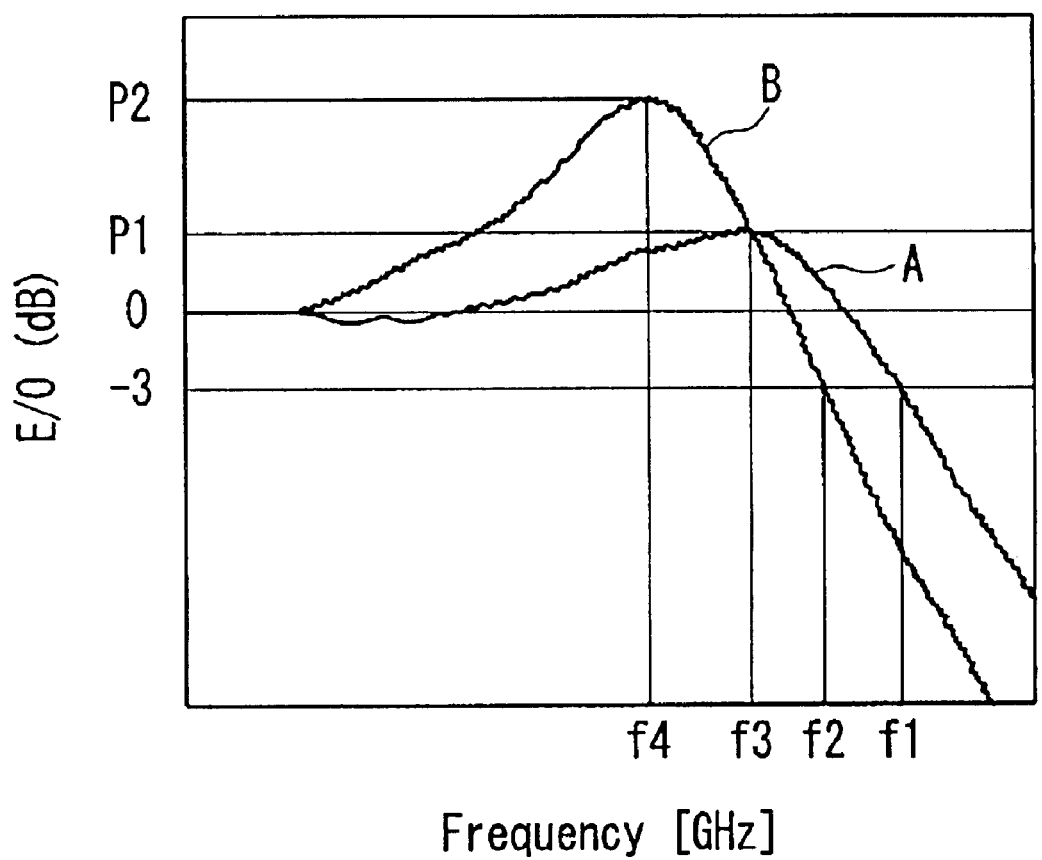
FIG. 9 is a diagram showing the frequency properties of the electrical-optical conversion efficiency of the optical module according to Embodiment 2 of the present invention.

FIG. 9 is a diagram showing the frequency properties of the electrical/optical signal conversion properties of the optical module. The horizontal axis denotes frequency and the vertical axis denotes the electrical/optical conversion gain, where A represents the properties of the optical module of Embodiment 2 and B represents the properties of a conventional optical module. The so-called "cutoff frequency" is the frequency at which the electrical/optical conversion gain is −3 dB. In FIG. 9, the cutoff frequency of the optical module according to Embodiment 2 is represented by f1 and the cutoff frequency of the conventional optical module is represented by f2, where f1 is 13 GHz and f2 is 12 GHz. In other words, it is clear that compared to the conventional configuration, Embodiment 2 has a higher cutoff frequency and a wider band.

The so-called "relaxation resonance frequency" is the frequency at which the electrical/optical conversion gain peaks. In FIG. 9, the relaxation resonance frequency of the optical module of Embodiment 2 is expressed as f3 and the relaxation resonance frequency of the conventional optical module is expressed as f4, where the electrical/optical conversion gain at this time is represented by P1 and P2, respectively. From FIG. 9 it can be understood that the peak P2 of the conventional electrical/optical conversion gain is larger than the peak P1 of the electrical/optical conversion gain of Embodiment 2. The change in electrical/optical conversion gain is related to the group delay characteristics, with a small change in electrical/optical conversion gain indicating favorable group delay characteristics. Put differently, the lower the peak of the electrical/optical conversion gain, the better the group delay characteristics. Consequently, Embodiment 2 has better group delay characteristics than the conventional configuration.

It should be noted that in Embodiment 2 the optical element 1 was a light-emitting element and the internally provided passive element 12 was a resistor element, but there are no limitations to this, and for example, the optical element 1 can be a light-receiving element and the passive element 12 can be a capacitive element.

Embodiment 3

Figure 10:
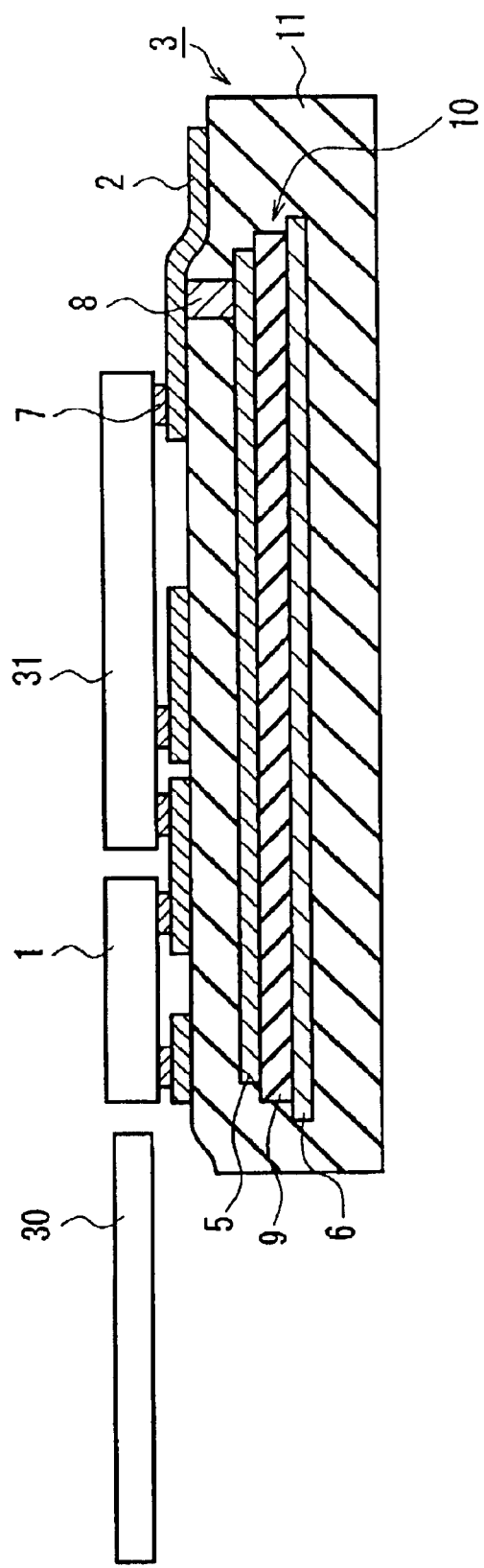
FIG. 10 is a cross-sectional view showing the configuration of the optical module according to Embodiment 3 of the present invention.

An optical module according to Embodiment 3 is described with reference to FIG. 10. FIG. 10 is a cross-sectional view showing the configuration of the optical module according to Embodiment 3.

The optical module of Embodiment 3 has a structure in which the passive element 10 is internally provided inside the multilayer substrate 3 and the optical element 1 and a semiconductor element 31, which are active elements, are provided on the surface of the multilayer substrate 3. The passive element 10 includes the first passive element electrode 5 and the second passive element electrode 6 sandwiching the passive element dielectric material 9 from above and below. The passive element dielectric material 9 is made of a material that differs from the insulating material of the insulating layer 11 of the multilayer substrate 3.

The optical element 1 and the semiconductor element 31 are flip-chip connected to the multilayer substrate 3 via the bumps 7 with their active surface facing the multilayer substrate 3. The passive element 10 is connected to the optical element 1 and the semiconductor element 31 via the via conductors 8 and the terminal electrodes 2 that are formed on the surface of the multilayer substrate 3. The optical element 1 and the semiconductor element 31 are arranged adjacent to one another and the passive element dielectric material 9 is formed at least in a region that is vertically below the bumps 7 of the optical element 1 and the semiconductor element 31, and is formed partially, that is, without spreading over the entire area. That is, the passive element dielectric material 9 is formed near portions corresponding to regions directly below the optical element 1 and the semiconductor element 31. Thus, the unevenness in the surface is small compared to regions where the optical element 1 and the semiconductor element 31 are not mounted. Consequently, there is little height difference between the terminal electrodes 2 at the regions where the optical element 1 and the semiconductor element 31 have been mounted, and the optical element 1 can be stably connected to the terminal electrodes 2.

The optical element 1 is for example a light-receiving element such as a photodiode for converting light signals to electrical signals or a light-emitting element such as a laser diode for converting electrical signals into light signals.

The semiconductor element 31 has either a function for amplifying signals from the optical element 1 or a function for driving the optical element 1. If the optical element 1 is a light-receiving element such as a photodiode, for example, then the semiconductor element 31 can be a wideband transimpedance amplifier for amplifying electrical signals from the photodiode. If the optical element 1 is a light-emitting element, then the semiconductor element 31 can be a wideband drive element for driving the light-emitting element.

If a material with a larger relative permittivity than the relative permittivity of the insulating film 11 of the multilayer substrate 3 is used as the passive element dielectric material 9, then the passive element 10 is a capacitive element, and if a resistor with greater conductivity than the conductivity of the insulating film 11 of the multilayer substrate 3 is used as the material of the passive element dielectric material 9, then the passive element 10 is a resistor element.

The optical element 1 and the semiconductor element 31 are arranged adjacent to one another and the passive element dielectric material 9 is formed only at necessary portions. As a result, the passive element dielectric material 9 is not formed at unnecessary portions, so that in the internal wiring layer, cross talk and stray capacitance at unnecessary portions can be inhibited. Also, the cutoff frequency can be increased so as to widen the band if the optical element 1 is a light-emitting element such as a laser diode and the semiconductor element 31 is an element for driving a laser diode or if the optical element 1 is a light-receiving element such as a photodiode and the semiconductor element 31 is an amplifier element for amplifying electrical signals from the photodiode.

Embodiment 4

Figure 11:
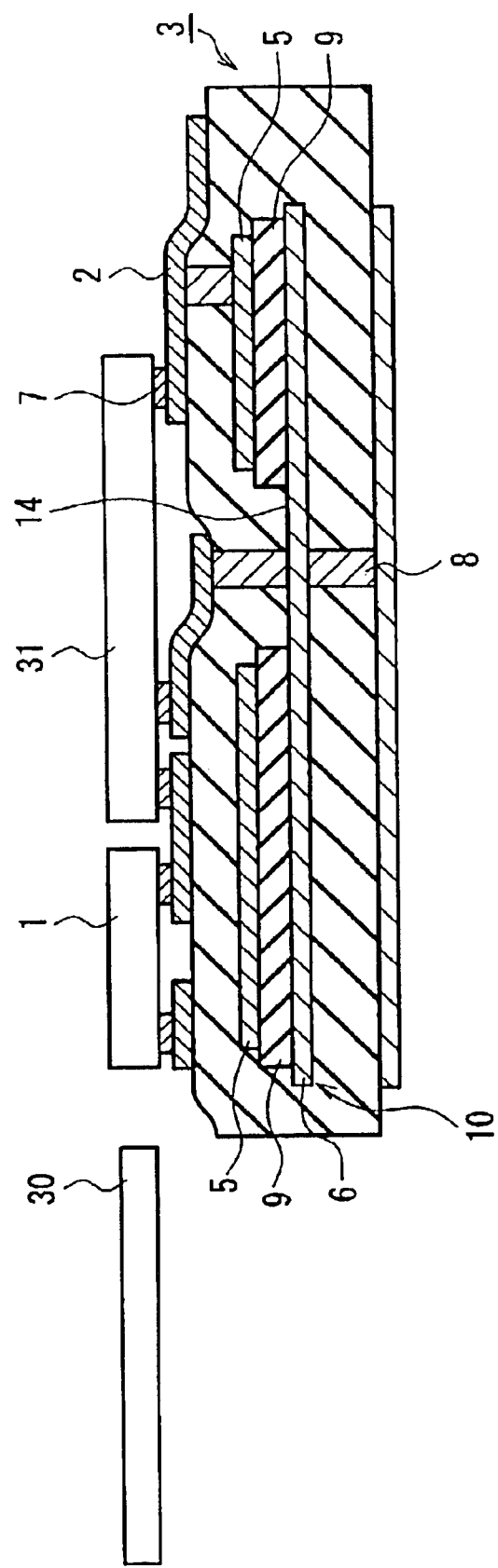
FIG. 11 is a cross-sectional view showing the configuration of the optical module according to Embodiment 4 of the present invention.

An optical module according to Embodiment 4 of the present invention is described with reference to the drawings. FIG. 11 is a cross-sectional view of the optical module and FIG. 12 is a plan view of the optical module.

The optical module of Embodiment 4, like the optical module according to Embodiment 3 shown in FIG. 9, has a passive element dielectric material 9 formed at least in a region vertically below the bumps 7 of the optical element 1 and the semiconductor element 31, and is formed partially, that is, without spreading over the entire area. In other words, the passive element dielectric material 9 is formed only near portions directly below the optical element 1 and the semiconductor element 31. Therefore, there is little unevenness in the surface of the multilayer substrate 3 where it is located, and the optical element 1 and the semiconductor element 31 can be stably flip-chip connected. Thus, an optical element with high yield can be obtained, and good high-frequency properties are obtained.

Figure 12:
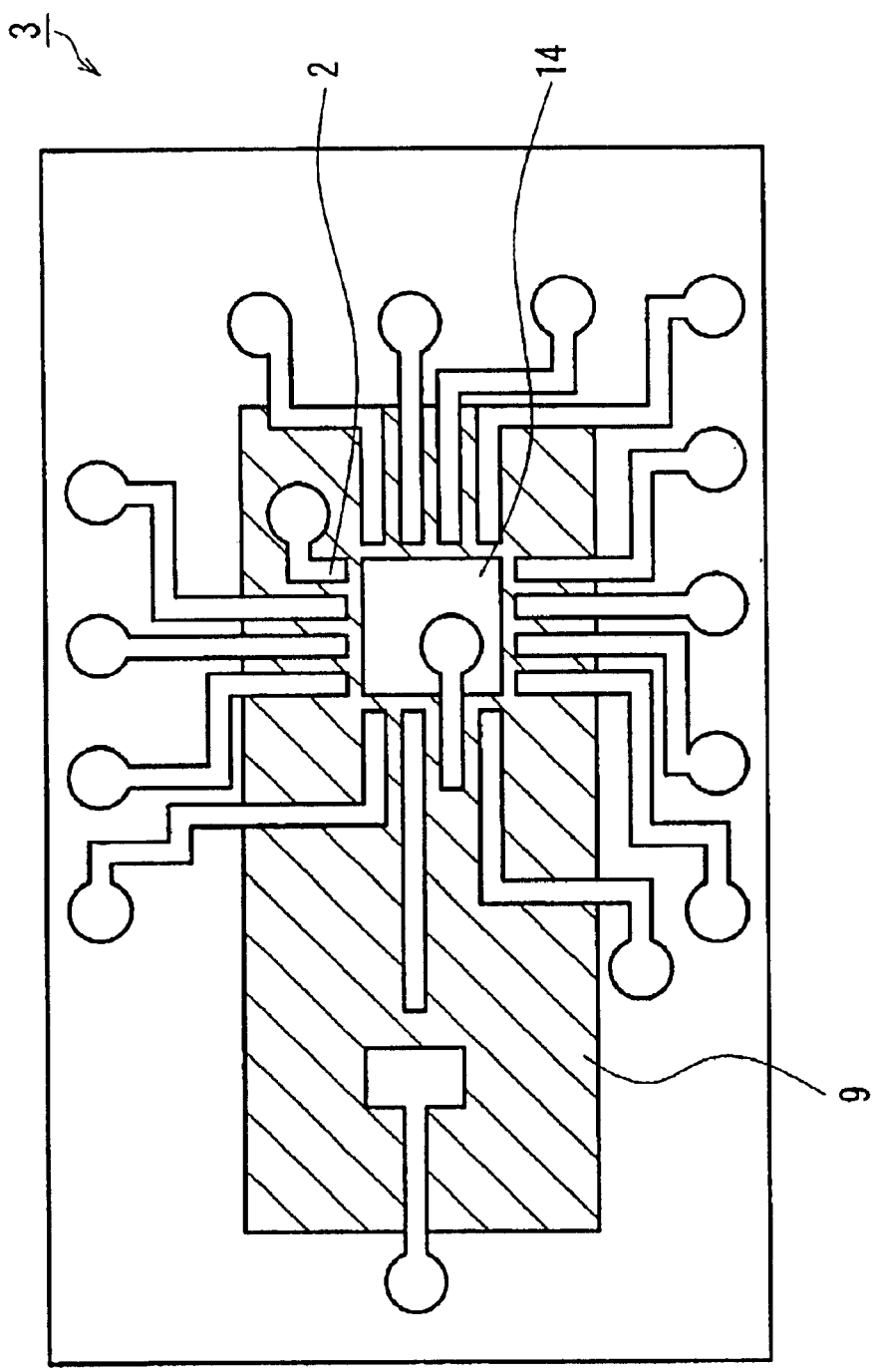
FIG. 12 is a plan view showing the configuration of the optical module according to Embodiment 4 of the present invention.

As shown in FIGS. 11 and 12, a region 14 where the passive element dielectric material 9 has not been formed is found outside the regions directly below the bumps 7 of the semiconductor element 31. By using the region 14, wiring can be achieved with a high degree of freedom without being restricted by the formation of the passive element 10. Also, because it is not necessary to form the passive element dielectric material 9 at unnecessary portions, cross talk and stray capacitance at unnecessary areas in the wiring layer within the multilayer substrate 3 can be inhibited and the cutoff frequency can be increased so as to increase the bandwidth. With this structure, if the optical element 1 is a light-emitting diode such as a laser diode and the semiconductor element 31 is an element for controlling a laser diode, then it is preferable that the via conductors 8 into which a material with high thermal conductivity has been filled are arranged at the region 14, where the passive element dielectric material 9 has not been formed. Consequently, heat from the drive element can be dissipated efficiently.

Embodiment 5

Figure 13:
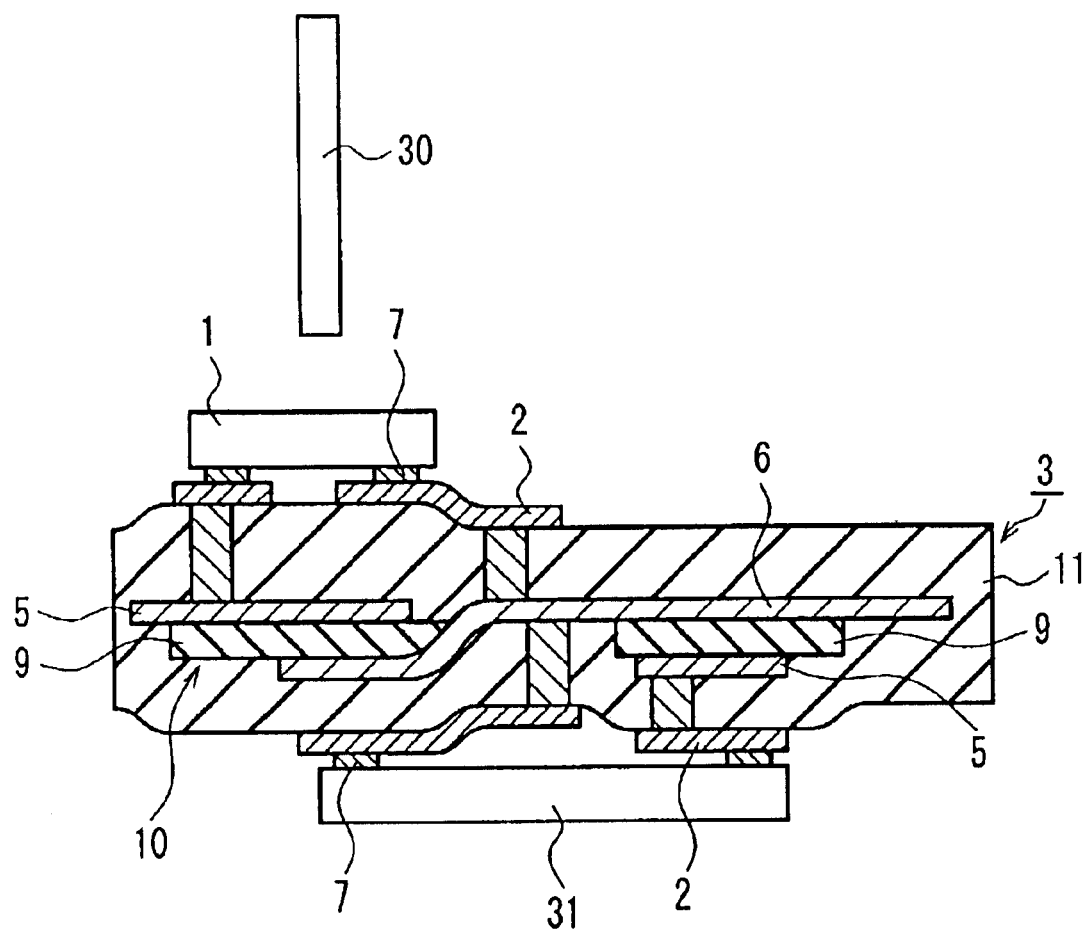
FIG. 13 is a cross-sectional view showing the configuration of the optical module according to Embodiment 5 of the present invention.

An optical module according to Embodiment 5 of the present invention is described using the drawings. FIG. 13 is a cross-sectional view of the optical module and FIGS. 14A–D is a cross-sectional view showing the process for manufacturing the optical module. It should be noted that the optical modules shown in FIGS. 13 and 14A–D are mirror images of one another.

In the optical module according to Embodiment 5, the optical element 1 is mounted onto one surface of the multilayer substrate 3 in which the passive element 10 has been internally provided, and the semiconductor element 31 is mounted onto the other surface. The passive element dielectric material 9 is formed at least in a region vertically below the bumps 7 of the optical element 1 and the semiconductor element 31, and is formed partially, that is, without spreading over the entire area. In other words, the passive element dielectric material 9 is formed only near portions directly below or directly above the optical element 1.

The method for manufacturing the optical module of Embodiment 5 is described next. It should be noted that the first sheet-shaped insulator 11a and the second sheet-shaped insulator 11b shown in FIG. 14 are laminated to form the insulating layer 11. As shown in FIG. 14A, a through hole is formed in the first sheet-shaped insulator 11a by a hole providing process using a puncher, and a conductive paste including silver powder as a primary component is filled into this through hole by a printing technique. The second element electrode 6 is formed on one surface of the first sheet-shaped insulator 11a, and in order to form a capacitive element, the passive element dielectric material 9 is formed by a printing technique, for example.

On the other hand, through holes are formed in the second sheet-shaped insulator 11b and a conductive paste is filled into these holes, as described above, after which a wiring pattern including the terminal electrodes 2 is formed on one surface of the second sheet-shaped insulator 11b and the first passive element electrode 5 is formed on the other surface.

Next, as shown in FIG. 14B, the first sheet-shaped insulator 11a and the second sheet-shaped insulator 11b are laminated to one another by applying heat and pressure in such a way that the passive element dielectric material 9 is sandwiched between the first passive element electrode 5 and the second passive element electrode 6. Next, this laminated body is sintered to form the multilayer substrate 3 in which the passive element 10 is internally provided.

The passive element dielectric material 9 is formed at least directly below the locations where the bumps 7 connected to the terminal electrodes 2 that were formed on the second sheet-shaped insulator 11b are formed, and is formed at least directly above the locations where the bumps 7 connected to the terminal electrodes 2 that were formed on the first sheet-shaped insulator 11a are formed, and moreover is formed partially, that is, without spreading over the entire area of the multilayer substrate 3.

Then, as shown in FIGS. 14C and 14D, after the optical element 1 and the semiconductor element 31 with the bumps 7 formed at their input/output terminals are aligned on opposing surfaces, they are flip-chip mounted to the terminal electrodes 2 on the multilayer substrate 3. Thus, the optical module is achieved.

With the optical module according to Embodiment 5, the multilayer substrate 3 has greater thickness at the regions where the passive element dielectric material 9 is formed than at the regions where it has not been formed. However, the unevenness in the surface where the terminal electrodes 2 for mounting the optical element 1 and the semiconductor 31 have been formed is only the extent of the variation that occurs during sintering of the passive element dielectric material 9 and the insulator of the multilayer substrate 3, and thus the optical element 1 and the semiconductor element 31 can be provided stably on the multilayer substrate 3. Also, the optical element 1 and the semiconductor element 31 are connected at a short distance from the passive element 10, and thus the optical module has excellent high frequency properties.

Also, as shown in FIG. 13, the optical fiber 30 is arranged with respect to the optical module of Embodiment 5 so that its optical axis is substantially perpendicular to the layered surface of the multilayer substrate 3. This is because the optical element 1 is a surface-emitting laser element. That is, this is the arrangement with which the optical fiber 30 can be optically coupled with the optical element 1. It should be noted that if the optical element 1 is a light-receiving element, then the optical fiber 30 is similarly arranged so that its optical axis is substantially perpendicular to the layered surface of the multilayer substrate 3. Also, to prevent the deterioration of noise characteristics caused by the effect of return light that occurs at the end face of the optical fiber 30, the angle formed by the optical axis of the optical fiber 30 and the emission direction of the optical element 1 (in the former case) is adjusted so that it is about one to two degrees.

Figure 15:
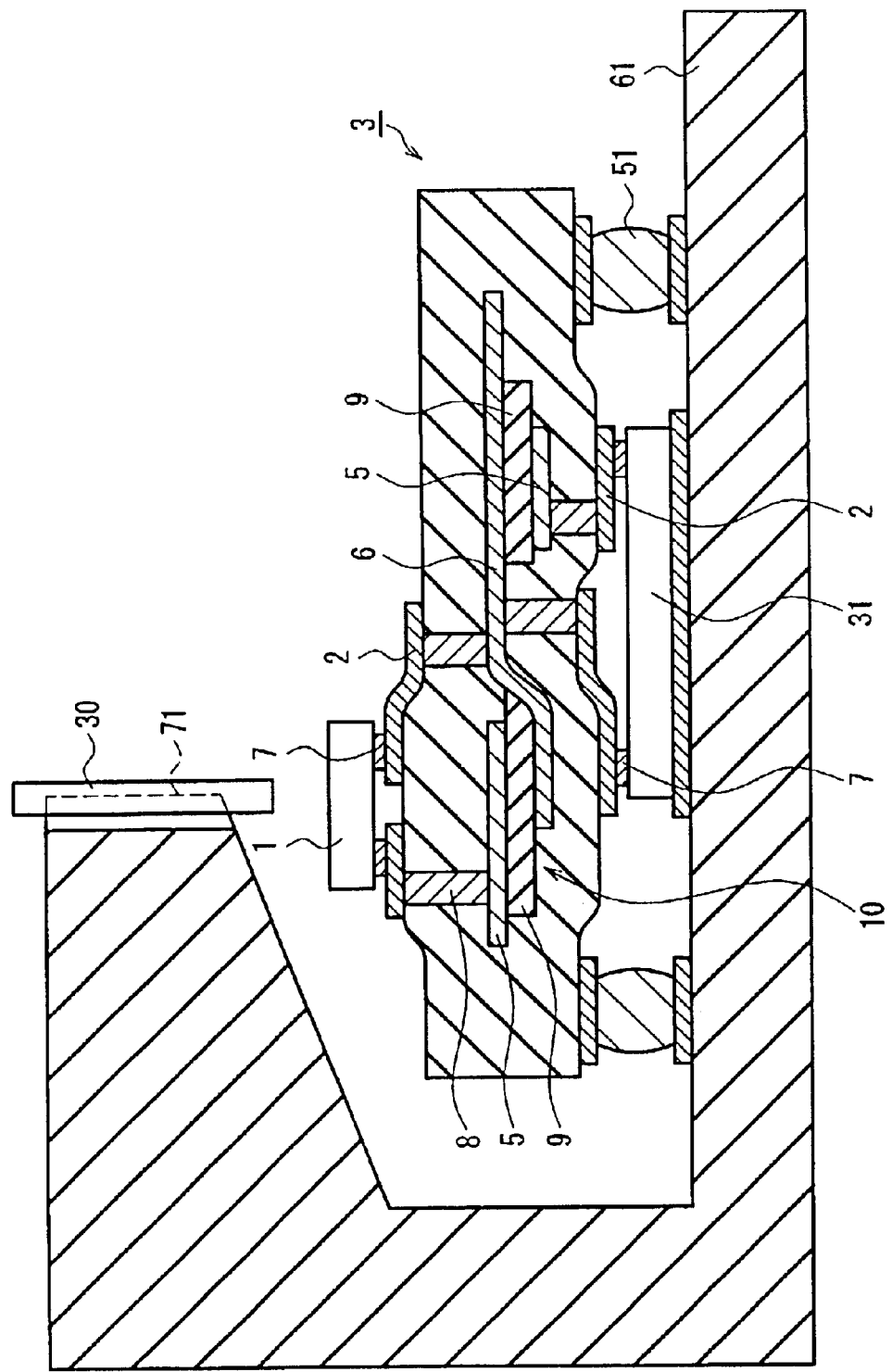
FIG. 15 is a cross-sectional view showing the configuration of a packaged unit including the optical module according to Embodiment 5 of the present invention.

The above-described optical module can be mounted onto the bench 61 via the connection terminals 51 as shown in FIG. 15. In particular, if the optical element 1 is a surface-emitting laser diode or the like and the semiconductor element 31 is an element for driving the laser diode, then the region where the optical element 1 and the optical fiber 30 are optically coupled and the region where the rear surface of the semiconductor element 31 is connected to the bench 61 together sandwich the multilayer substrate 3, and therefore the optical element 1 and the optical fiber 30 easily can be optically coupled to one another and heat from the semiconductor element 31 can be dissipated easily.

Also, by providing the optical fiber securing groove 71 for fastening the optical fiber 30 in the bench 61, the optical axes easily can be aligned simply by arranging the optical fiber 30 in the optical fiber securing groove 71.

Embodiment 6

Figure 16A:
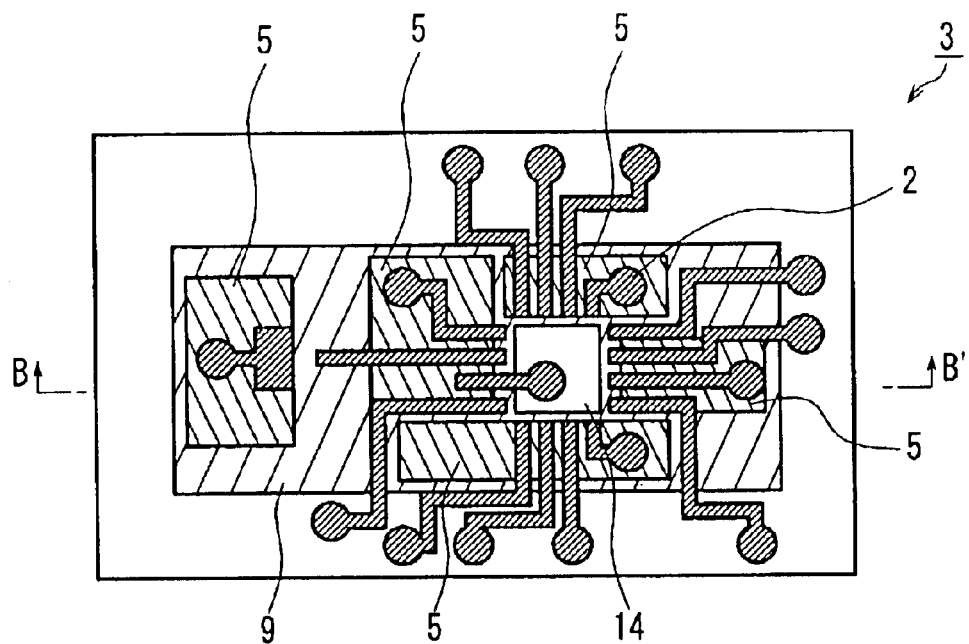
FIGS. 16A–B is a diagram of the configuration of the optical module according to Embodiment 6 of the present invention, where
Figure 16B:
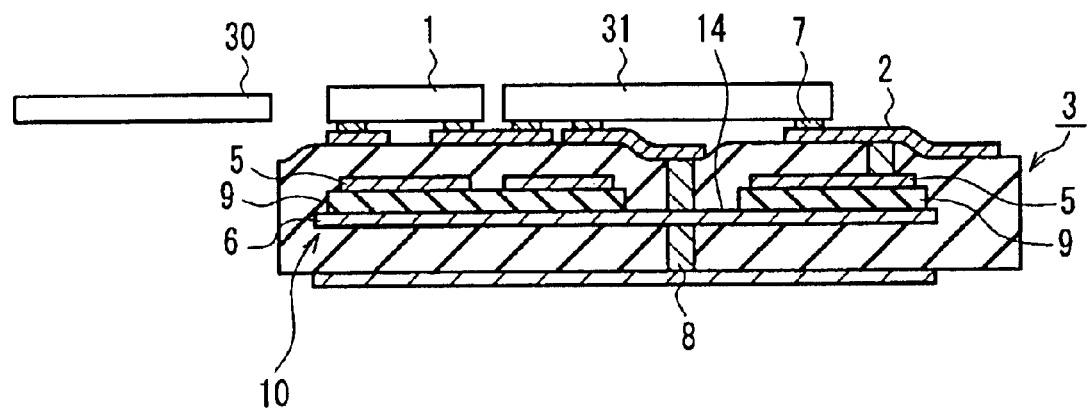

The optical module according to Embodiment 6 of the present invention is described with reference to FIGS. 16A–B. FIG. 16A is a plan view and FIG. 16B is a cross-sectional view.

A characteristic of the optical module according to Embodiment 6 is that the first passive element electrode 5 that is provided in contact with the passive element dielectric material 9 formed in the multilayer substrate 3 is not formed as a single unit but instead is divided into a plurality of units.

The optical module according to Embodiment 6, as can be understood from the plan view of FIG. 16A, has a first passive element 5 that has been divided into five units. If the passive element 10 is internally provided as a capacitive element, then it is preferable that the number of divisions of the first passive element electrode 5 is the total of the number of power source terminals of the optical element 1 and the number of high-frequency power source terminals of the semiconductor element 31. By doing this, each terminal can be set to a different voltage.

For example, if the passive element dielectric material 9 layer is provided at a thickness of 30 $\mu$m using a material with a relative permittivity of 4000, then a capacitance of approximately 1000 pF can be obtained by providing the first passive element electrode 5 with dimensions of 0.95 mm×0.95 mm. If the dimensions of the semiconductor element 31 are 2 mm×2 mm, then the passive element 10, which is a capacitance element with approximately 1000 pF, is directly below the semiconductor element 31 and four passive element electrodes 5 can be arranged near the semiconductor element 31, and the four power source terminals with different voltages can be connected to the passive element 10 that is internally provided in the multilayer substrate 3.

The capacitance can be freely controlled by altering the material and the thickness of the layer of the passive element dielectric material 9 and the dimensions of the first passive element electrode 5 and the second passive element electrode 6. The shape of the electrodes can be freely chosen so as to achieve a capacitive element with a different capacitance at each terminal.

Also, as shown in FIG. 16B, a region 14 where the passive element dielectric material 9 has not been formed is given outside the region directly below the bumps 7 of the semiconductor element 31. By using the region 14, wiring can be achieved with a high degree of freedom without being restricted by the formation of the passive element 10. Also, because it is not necessary to form the passive element dielectric material 9 at unnecessary portions, cross talk and stray capacitance at unnecessary areas in the wiring layer within the multilayer substrate 3 can be inhibited and the cutoff frequency can be increased so as to increase the bandwidth. With this structure, if the optical element 1 is a light-emitting diode such as a laser diode and the semiconductor element 31 is an element for controlling a laser diode, then it is preferable that the via conductors 8 into which a material with high thermal conductivity has been filled are arranged at the region 14, where the passive element dielectric material 9 has not been formed. Consequently, heat from the drive element can be dissipated efficiently.

As described above, according to the optical module of Embodiment 6, the optical element 1 can be connected to the passive element 10, which has different characteristics at each of a plurality of terminals in the semiconductor element 31, with a minimum distance between them. Thus an optical module with which an optimal circuit configuration can be achieved for each terminal is obtained.

Furthermore, if the optical element 1 is a light-receiving element such as a photodiode and the semiconductor element 31 is an amplifier element for amplifying electrical signals from the photodiode, then the cutoff frequency can be increased to thereby widen the bandwidth.

Embodiment 7

Figure 17:
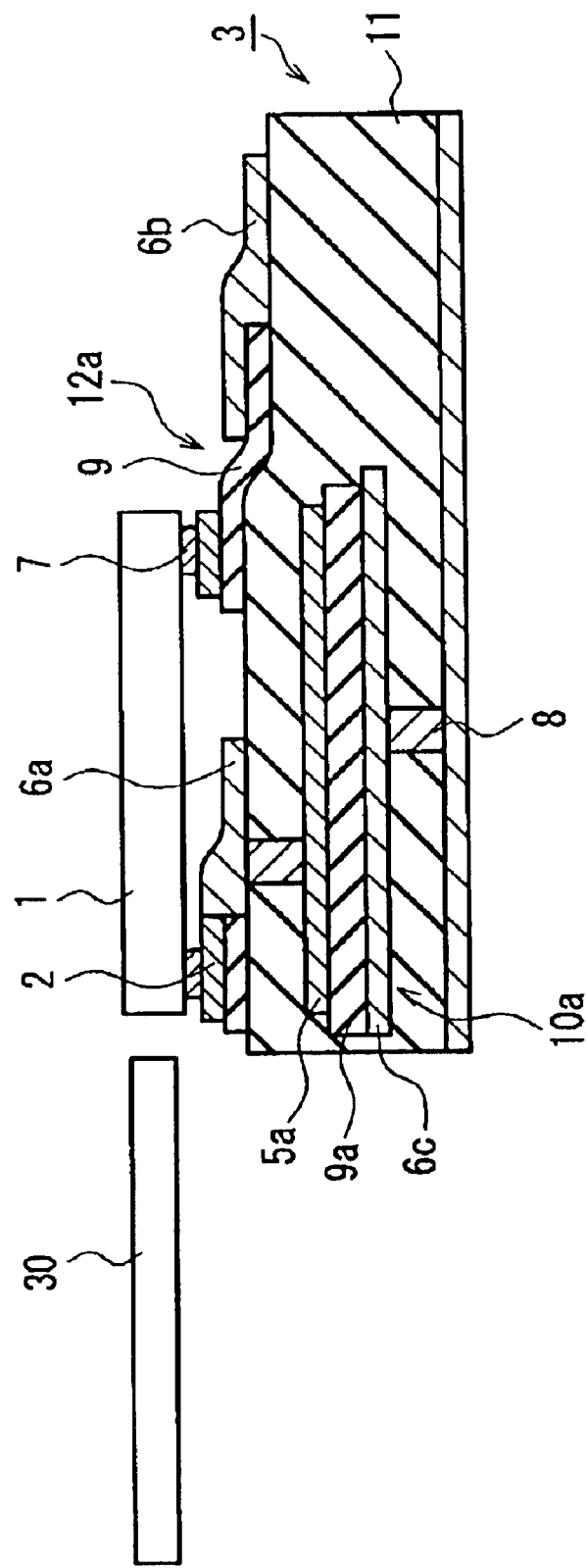
FIG. 17 is a cross-sectional view showing the configuration of the optical module according to Embodiment 7 of the present invention.

The optical module according to Embodiment 7 of the present invention is described with reference to FIG. 17. As shown in FIG. 17, a passive element 12a is formed on the surface of the multilayer substrate 3. The passive element 12a includes the terminal electrodes 2, the second passive element electrodes 6a and 6b, and the passive element dielectric material 9. The terminal electrodes 2 are adhered to the upper surface of the passive element dielectric material 9 that is formed on the multilayer substrate 3. The terminal electrodes 2 are electrodes connected to the optical element 1 via the bumps 7, but also function as the electrodes of the passive element 12a. The passive element dielectric material 9 is at least formed in regions vertically below the bumps 7 of the optical element 1 and is formed partially, that is, without spreading over the entire area. That is, the passive element dielectric material 9 is formed near portions that are directly below the optical element 1, and thus disparities in height do not occur between the terminal electrodes 2 at which the bumps are formed. Also, the optical module has good high frequency properties.

The second passive element electrodes 6a and 6b are formed on the multilayer substrate 3 so that they are connected to the end portions of the passive element dielectric material 9. Of these two electrodes, the second passive element electrode 6a and one of the terminal electrodes 2 are electrically connected. In addition, the second passive element electrode 6b, which is not in contact with a terminal electrode 2, is formed covering at least a portion of the passive element dielectric material 9.

In addition, a passive element 10a is provided inside the multilayer substrate 3, and has a different function than the passive element 12a that is formed on the surface of the multilayer substrate 3. At least one of a first passive element electrode 5a and a second passive electrode 6c, which make up the passive element 10a that is provided inside the multilayer substrate 3, is electrically connected to a terminal electrode 2 on the surface of the multilayer substrate 3 via a via conductor 8. Moreover, a passive element dielectric material 9a, which is made of a material different from the insulating material of the insulating layer 11 of the multilayer substrate 3 and the material of the passive element dielectric material 9 included in the passive element 12a that is provided on the surface of the multilayer substrate 3, is formed at least in a region that corresponds to directly below the bumps 7 that are connected to the terminal electrodes 2 of the optical element 1, and the passive element dielectric material 9 is not formed spreading over the entire area of the multilayer substrate 3.

If the optical element 1 is an end face-illuminated photodiode or an end face-emitting laser diode, then, as shown in FIG. 17, the optical fiber 30 is arranged at the end face of the optical element 1 so that the optical element 1 and the optical element 30 are optically coupled. Alternatively, if the optical element 1 is a top face or rear face-illuminated photodiode or a surface-emitting laser diode, then, although not shown in FIG. 17, the optical fiber 30 is arranged above the optical element 1 so that the optical element 1 and the optical fiber 30 are optically coupled. For the optical element 1, it is possible to use a light-emitting element such as a laser diode or a light-receiving element such as a photodiode.

As described above, according to the optical module of Embodiment 7, the multilayer substrate 3 and the optical element 1 can be stably flip-chip connected, and an optical module with a high yield can be obtained. Also, the optical elements 12a and 10a, which have a plurality of different functions, can be connected to the optical element 1 with short wiring, and thus the parasitic impedance between the optical element 1 and the passive elements 12a and 10a can be reduced and excellent high frequency properties are achieved. In particular, if a capacitance element (passive element 10a) is formed inside the multilayer substrate 3 and a resistor element (passive element 12a) is formed on the surface of the multilayer substrate 3, then the frequency properties when the optical signals emitted from the optical element 1 are converted into electrical signals include a cutoff frequency at which the conversion gain is halved that is increased to a higher frequency, and the input impedance seen from outside the optical module can be kept constant over a wide bandwidth.

Embodiment 8

Figure 18:
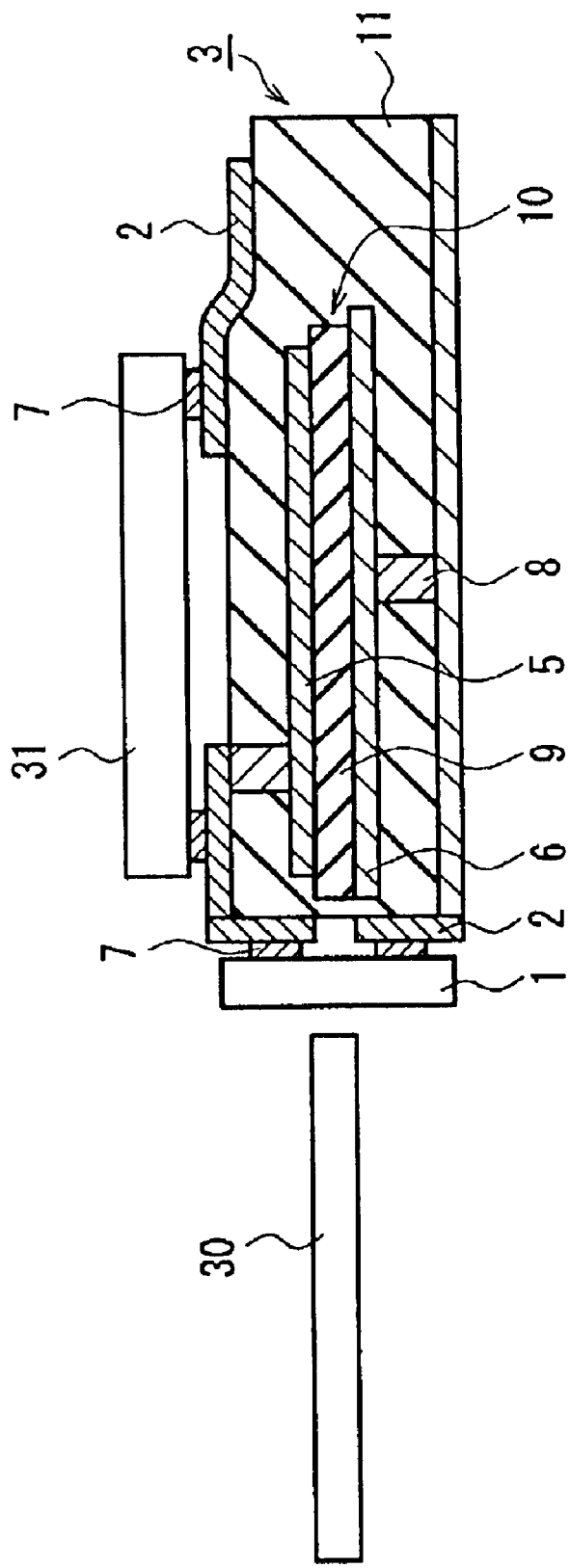
FIG. 18 is a cross-sectional view showing the configuration of the optical module according to Embodiment 8 of the present invention.
Figure 19:
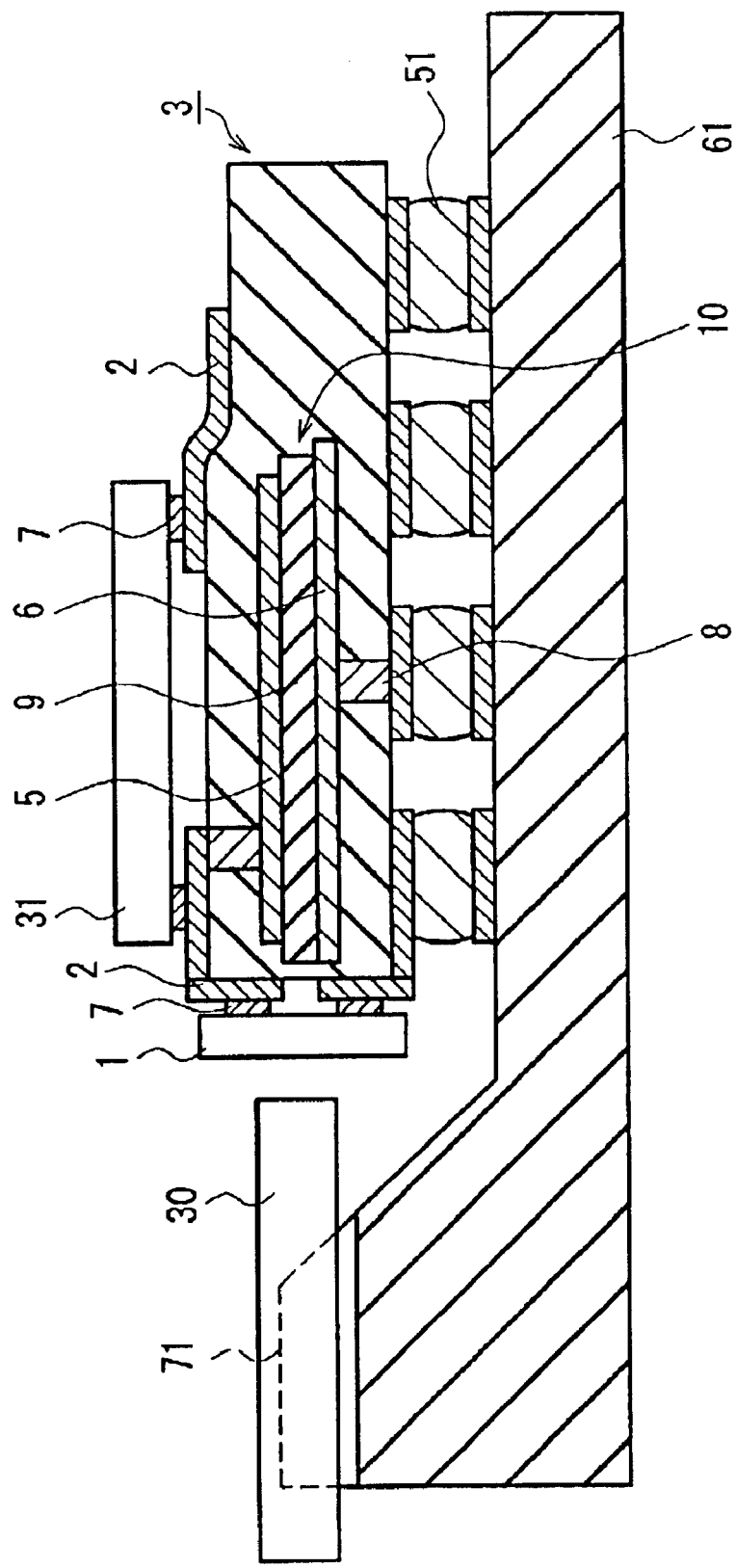
FIG. 19 is a cross-sectional view showing the configuration of a packaged unit including the optical module according to Embodiment 8 of the present invention.

The optical module according to Embodiment 8 of the present invention is described with reference to the drawings. FIG. 18 is a cross-sectional view of the optical module and FIG. 19 is a cross-sectional view of a packaged unit including the optical module.

As shown in FIG. 18, the passive element 10 is provided inside the multilayer substrate 3, and the first passive element electrode 5 and the second passive element electrode 6 that make up the passive element 10 are connected to the terminal electrodes 2 on the surface of the multilayer substrate 3 via a via conductor 8. The semiconductor element 31 is flip-chip connected to the terminal electrodes 2 on the multilayer substrate 3 via the bumps 7. The passive element dielectric material 9, which is included in the passive element 10 and is made of a material that is different from the insulating material of the insulating layer 11 of the multilayer substrate 3, is formed at least in regions vertically below the bumps 7 of the semiconductor element 31, and is formed partially, that is, without spreading over the entire area of the multilayer substrate 3. That is, the passive element dielectric material 9 is formed only near portions that are directly below the semiconductor element 31. Thus, no unevenness results at the spots where the bumps 7 of the terminals electrodes 2 are formed, and the passive element 10 has excellent high frequency properties.

In addition, the optical element 7 is flip-chip connected to the terminal electrodes 2 that are formed on the end face of the multilayer substrate 3 via the bumps 7. The terminal electrodes 2 that are formed on the surface of the multilayer substrate 3 and the terminal electrodes 2 that are formed on the end face of the multilayer substrate 3 are electrically connected.

The optical element 1 can be for example a light-receiving element such as a rear face-illuminated photodiode, and the semiconductor element 31 can be for example a wideband transimpedance amplifier for amplifying electrical signals from a photodiode.

If the optical element 1 is a light-emitting element such as a surface-emitting laser diode, then a wideband drive element for driving the light-emitting element can be used as the semiconductor element 31.

Thus, with the optical module, unevenness in the surface of the terminal electrodes 2 that are provided on the surface of the multilayer substrate 3 can be prevented, and thus the multilayer substrate 3 and the semiconductor element 31 can be flip-chip connected stably. Consequently, an optical module with high yield can be obtained. In addition, because the optical element 1 and the semiconductor element 31 are connected to the passive elements, including the passive element 10, with a short distance between them, an optical module with excellent high frequency properties can be obtained.

In addition, by configuring the above optical module using a light-emitting element such as a surface-emitting laser diode or a light-receiving element such as a rear face-illuminated photodiode as the optical element 1, the optical module can be mounted to a bench 61 provided with an optical fiber securing groove 71 via connector terminals 51 as shown in FIG. 19. By doing this, the optical fiber 30 and the optical element 1 in the optical module can be optically connected with ease.

Embodiment 9

The optical module according to Embodiment 9 of the present invention is described with reference to FIG. 20.

Figure 20:
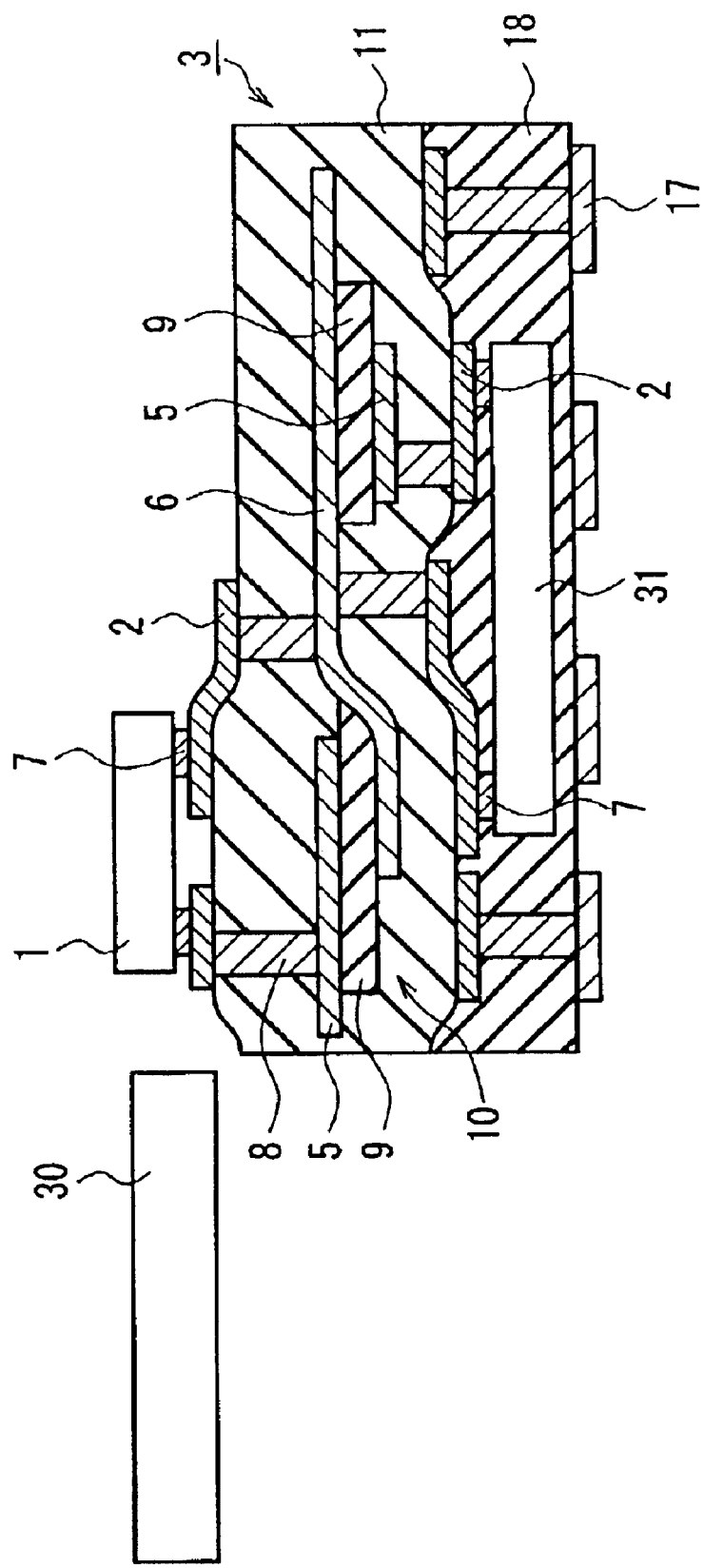
FIG. 20 is a cross-sectional view showing the configuration of the optical module according to Embodiment 9 of the present invention.

As shown in FIG. 20, in the optical module according to Embodiment 9, terminal electrodes 2 are formed on the surface of the multilayer substrate 3, and the first passive element electrode 5 and the second passive element electrode 6 of the passive element 10 provided inside the multilayer substrate 3 are connected to the optical element 1 and the semiconductor element 31, respectively, via the via conductors 8 and the terminal electrodes 2. The optical element 1 and the semiconductor element 31 are flip-chip connected to the terminal electrodes 2 formed on both primary faces of the multilayer substrate 3 via the bumps 7. The passive element dielectric material 9, which is made of a different material from the insulating layer 11 of the multilayer substrate 3, is formed at least in regions that are vertically below and above the bumps 7 of the optical element 1 and the semiconductor element 31, respectively, and is formed partially, that is, without spreading over the entire area of the multilayer substrate 3. That is, the passive element dielectric material 9 is formed only near portions that are directly below the optical element 1 and portions that are directly above the semiconductor element 31.

In addition, an electrically insulating mixture 18 including inorganic filler and a thermosetting resin composition is packed around the semiconductor element 31. A wiring pattern 17 is formed on the surface of the mixture 18, and via conductors 8 for connecting this wiring pattern 17 and the terminal electrodes 2 of the multilayer substrate 3 have been formed.

For the thermosetting resin of the mixture 18, it is possible to use an epoxy resin or a phenolic resin, for example, and for the inorganic filler it is possible to use alumina, silicon nitride, beryllia (BeO), MgO, aluminum nitride, or $SiO_2$, for example. Also, if necessary, a coupling agent, a dispersing agent, or a coloring agent also may be added.

Figure 21:
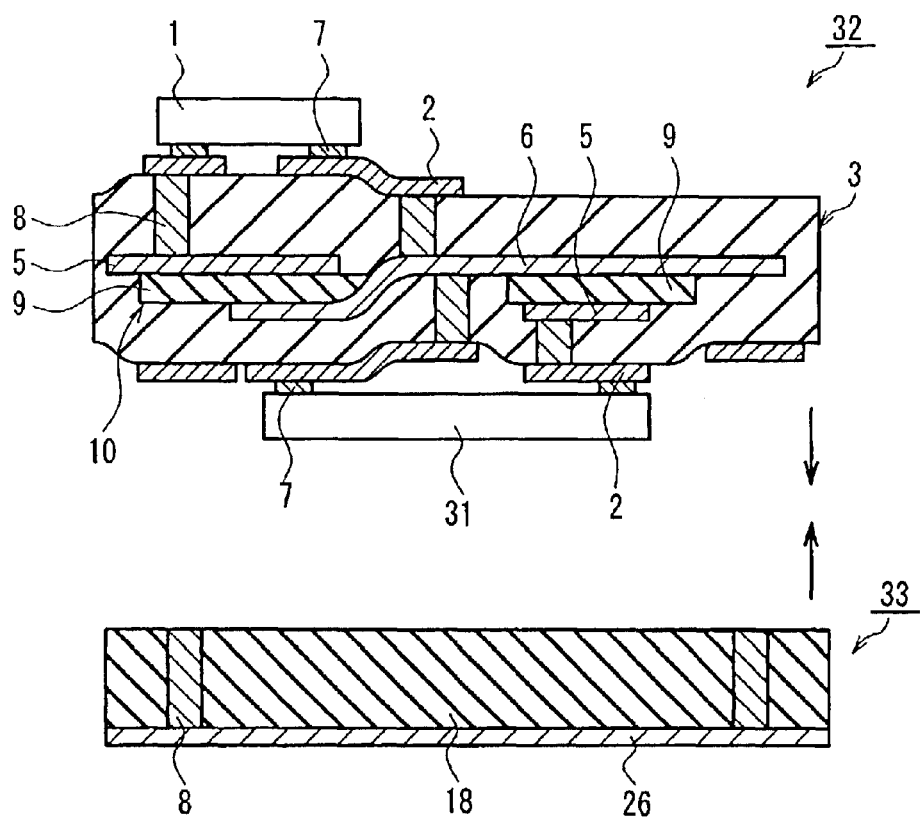
FIG. 21 is a cross-sectional view showing a method of manufacturing the optical module according to Embodiment 9 of the present invention.
Figure 22:
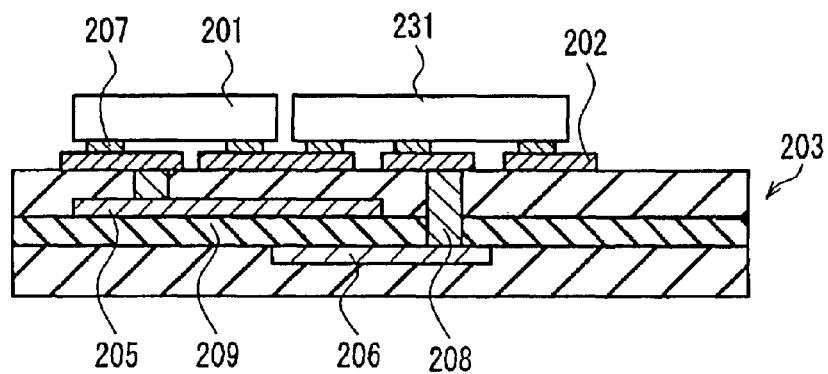
FIG. 22 is a cross-sectional view showing the configuration of a conventional optical module for optical communications.
Figure 23A:
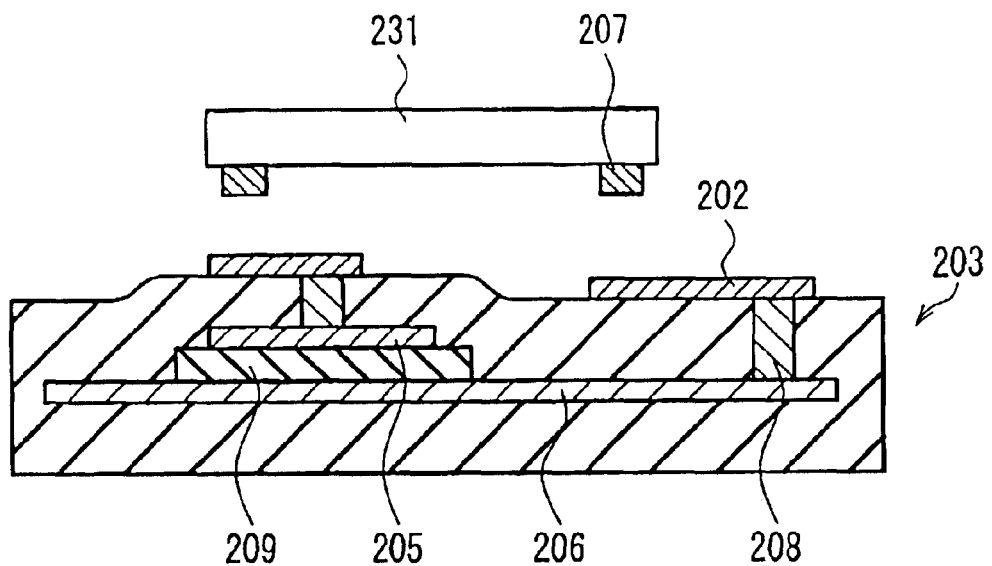
FIGS. 23A–B is a cross-sectional view showing the steps for manufacturing another conventional optical module for optical communications, where
Figure 23B:
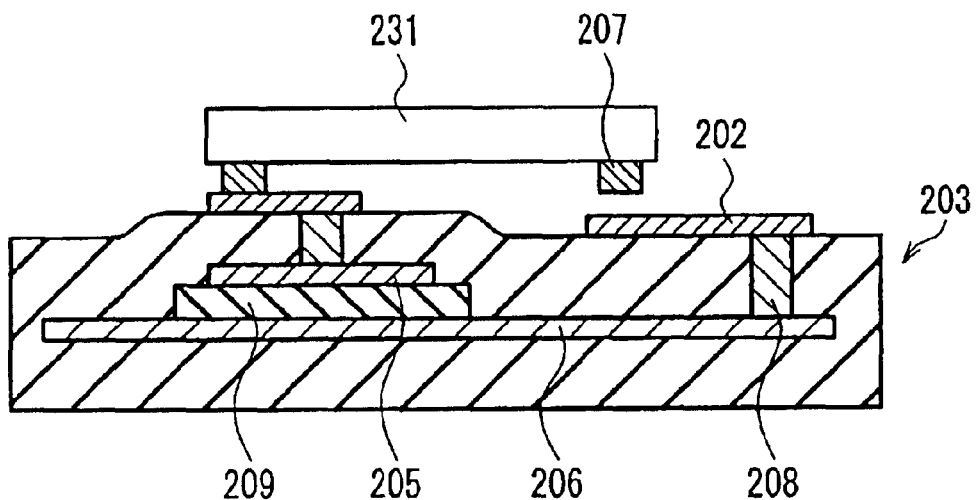
Figure 24:
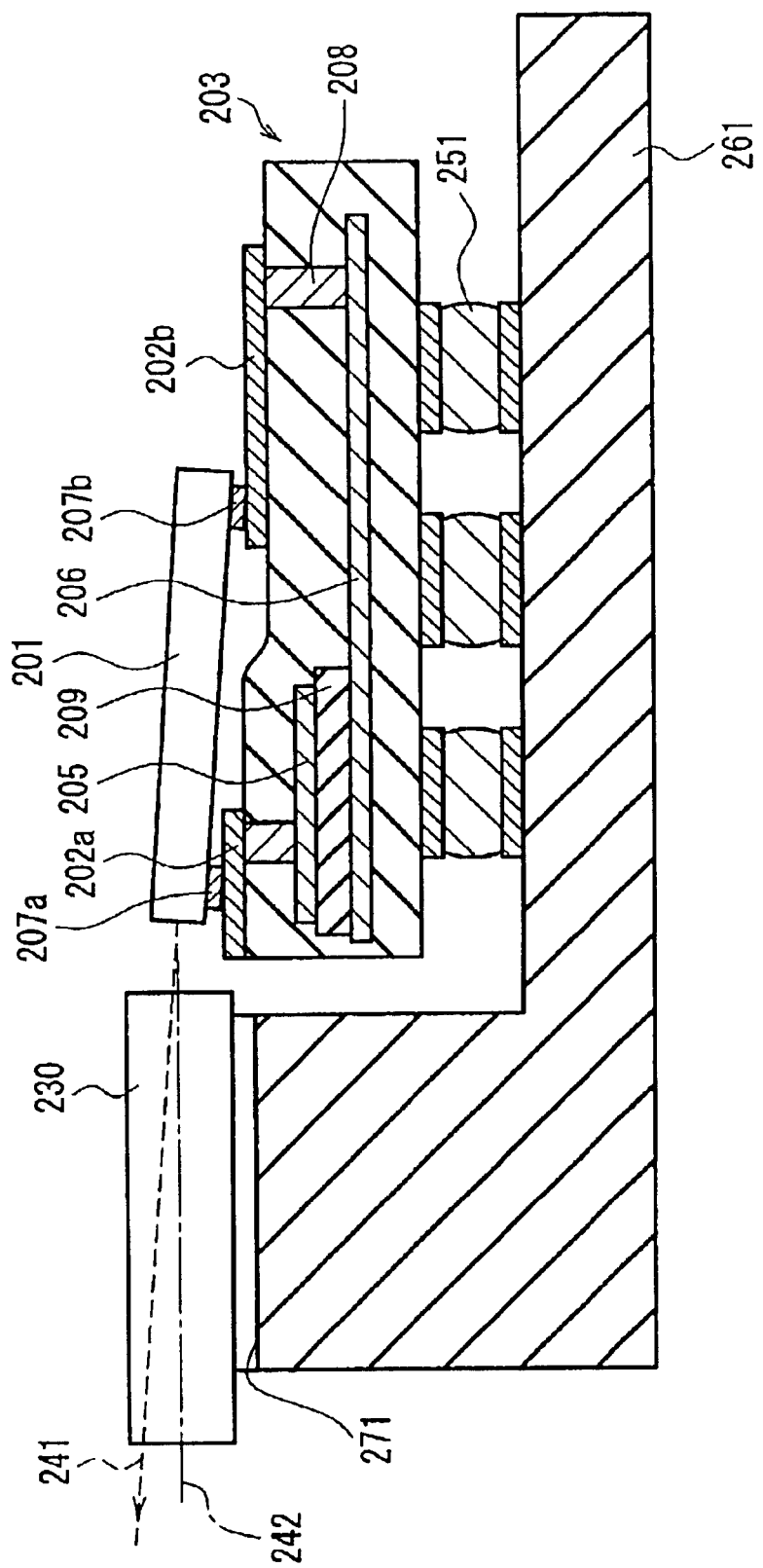
FIG. 24 is a cross-sectional view illustrating an off-center optical axis of the other conventional optical module for optical communications.

Next, the method of manufacturing the optical module of Embodiment 9 is described using FIG. 21. An optical module 32 is an optical module similar to the optical module according to Embodiment 5 shown in FIG. 13, and the optical element 1 is mounted to one surface of the multilayer substrate 3, in which the passive element 10 has been provided internally, and the semiconductor element 31 is mounted on the other surface. The passive element dielectric material 9 at the positions where the bumps 7 connected to the terminals electrodes 2 that are electrically connected to the optical element 1 and the semiconductor element 31, respectively, are formed, is formed at least at regions vertically below the bumps 7 of the optical element 1 and is formed partially, that is, without spreading over the entire area of the multilayer substrate 3. That is, the passive element dielectric material 9 is formed only near the regions directly below the optical element 1.

Next, a sheet-shaped mixture 33 is made by processing the mixture 18 of an inorganic filler and an uncured thermosetting resin into a sheet shape, forming through holes therein and filling a conductive paste into the through holes to form via conductors 8, and then aligning this with copper foil 26. The mixture 33 is heated and pressed against the optical module 32 to pack the mixture 18 of the inorganic filler and the thermosetting resin around the semiconductor element 31, thereby producing the optical module according to Embodiment 9.

Next, the process for providing the mixture 18 of inorganic filler and uncured thermosetting resin in a sheet shape is described. Inorganic filler and liquid thermosetting resin are mixed to fabricate a kneaded product with a paste consistency, which is then provided at a uniform thickness and thermally processed under conditions that are described below to obtain a sheet-shaped mixture in which the thermosetting resin is uncured.

Alumina powder, for example, can be used for the inorganic filler, and an epoxy resin, for example, can be used for the thermosetting resin. When these are processed into a sheet shape, the mixture 18 is sandwiched by a polyethylene terephthalate film that has been subjected to a mold-release process, and then is pressed to a predetermined thickness as heat and pressure are applied. At this time, the uncured sheet-shaped mixture can be obtained by processing at a temperature below the temperature at which the thermosetting resin starts curing. For example, if the temperature at which the epoxy film starts curing is 130° C., then the procedure can be carried out at a thermal processing temperature of 120° C. and a pressure of 0.98 MPa. The mixture 18 is formed at a greater thickness than the thickness of the semiconductor element 31. After the mixture 18 has been processed into a sheet shape, the through holes are formed by laser processing or punching. For example, a conductive paste that is fabricated by kneading a conductive material such as gold, silver, or copper powder with a thermosetting resin made of an epoxy resin and a curing agent can be filled into the through holes using a printing technique or the like.

The copper foil 26 is then formed on one primary face of the mixture 18, thereby obtaining the sheet-shaped mixture 33.

The procedure for packing the mixture 18 of inorganic filler and thermosetting resin around the semiconductor element 31 is carried out with the thermosetting resin in the sheet-shaped mixture 33 in a state prior to curing. The optical module 32 and the sheet-shaped mixture 33 are pressed and heated to a temperature of 175° C. These conditions are maintained for one hour so as to cure completely the mixture 18 of the sheet-shaped mixture 33 and the conductive paste packed into the through holes. Lastly, the copper foil 26 on the surface is processed by etching, for example, to form the wiring pattern 17.

It should be noted that the semiconductor element 31 protrudes from the surface of the multilayer substrate 3, and thus when the optical module 32 and the sheet-shaped mixture 33 are pressed, force is applied to the sheet-shaped mixture 18, causing the thermosetting resin in the sheet-shaped mixture 18 to flow out to regions in which the semiconductor element 31 is not present, that is, to the regions on either end of the multilayer substrate 3. Thus, the packing ratio of the inorganic filler is increased in the region vertically below the semiconductor element 31. The inorganic filler has a much higher thermal conductivity than the thermosetting resin, and thus the region vertically below the semiconductor element 31 comes to have a high thermal conductivity. Consequently, there is improved heat dissipation from below the semiconductor element 31.

As described above, with the optical module of Embodiment 9, an optical module with excellent heat dissipation properties can be obtained by choosing any inorganic filler with high thermal conductivity for the sheet-shaped mixture 18 that is packed around the semiconductor element 31.

Also, if the optical element 1 is a light-emitting element such as an end face-emitting laser diode, then by mounting the optical module onto a bench provided with an optical fiber fastening groove via connection terminals, the optical fiber 30 and the optical element 1 in the optical module can be optically coupled with ease.

It should be noted that materials and various numerical values specifically shown in Embodiments 1 to 9 are only illustrative examples, and the present invention should not be construed as limited to only these specific examples.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optical module comprising:

a substrate comprising an insulating layer, a passive element provided inside or on a surface of the insulating layer, and terminal electrodes formed on the surface of the insulating layer; and at least one active element, which includes at least an optical element and is connected to the terminal electrodes on the substrate surface;

wherein the passive element has a dielectric layer, a resistive layer, or a magnetic layer;

at least one of the terminal electrodes is connected to the passive element;

at least one of the at least one active element has a protruding electrode and is flip-chip mounted to the terminal electrodes on a principle face of the substrate via the protruding electrode;

taking a plane parallel to the principle face of the substrate as a projection plane, an area of orthographic projection of the dielectric layer, the resistive layer, or the magnetic layer is smaller than an area of orthographic projection of the principle face of the substrate; and the dielectric layer, the resistive layer, or the magnetic layer is formed such that the orthographic projection, with respect to the projection plane, of all the protruding electrodes of the at least one active element that is flip-chip mounted to the principle face of the substrate is included in the orthographic projection of the dielectric layer, the resistive layer, or the magnetic layer.

2. The optical module according to claim 1, wherein the at least one active element that has been flip-chip mounted is present on only one principle face of the substrate.

3. The optical module according to claim 1, wherein the at least one passive element that has been flip-chip mounted is present on both principle faces of the substrate.

4. The optical module according to claim 3, wherein the at least one active element includes an optical element and a semiconductor element;

the optical element is flip-chip mounted to the terminal electrodes on one principle face of the substrate; and the semiconductor element is flip-chip mounted to the terminal electrodes on the other principle face of the substrate.

5. The optical module according to claim 4, wherein a mixture including an inorganic filler and a thermosetting resin composition is packed around the semiconductor element.

6. The optical module according to claim 5, wherein the inorganic filler includes at least one of alumina, aluminum nitride, silicon nitride, beryllia (BeO), and silica.

7. The optical module according to claim 1, further comprising terminal electrodes on an end face of the substrate and an active element flip-chip mounted to these terminal electrodes.

8. The optical module according to claim 7, wherein the at least one active element includes an optical element and a semiconductor element;

the optical element is flip-chip mounted to the terminal electrodes that are formed on an end face of the substrate; and the semiconductor element is flip-chip mounted to the terminal electrodes that are formed on the principle face of the substrate.

9. The optical module according to claim 1, wherein a total of a distance between the surface of the dielectric layer, the resistive layer, or the magnetic layer and a center of a region of contact between the protruding electrode of an optical element that has been flip-chip mounted to the principle face of the substrate and the terminal electrode, and a distance from a point where a perpendicular line passing through the center of the region of contact between the protruding electrode and the terminal electrode intersects with the surface of the dielectric layer, the resistive layer, or the magnetic layer to the end portion of the dielectric layer, the resistive layer, or the magnetic layer that is farthest from that point, is less than a distance corresponding to ½ the wavelength of the electrical signals that are processed by the optical element.

10. The optical module according to claim 1, wherein the dielectric layer, the resistive layer, or the magnetic layer is formed independently at one or at each of a plurality of the terminal electrodes that are formed on the principle face of the substrate.

11. The optical module according to claim 1, wherein the at least one active element includes a semiconductor element.

12. The optical module according to claim 11, wherein a region where the dielectric layer, the resistive layer, or the magnetic layer has not been formed is present in the region where the orthographic projection with respect to the projection plane of all the protruding electrodes of the semiconductor element that is flip-chip mounted to the principle face of the substrate is not formed.

13. The optical module according to claim 12, wherein a via conductor is formed in a region where the dielectric layer, the resistive layer, or the magnetic layer has not been formed.

14. The optical module according to claim 11, wherein the optical element is a light-receiving element, and the semiconductor element is an amplifier element for amplifying signals of the light-receiving element.

15. The optical module according to claim 14, wherein the light-receiving element is a rear face-illuminated photodiode, and the semiconductor element is a transimpedance-type wideband amplifier.

16. The optical module according to claim 11, wherein the optical element is a light-emitting element, and the semiconductor element is a drive element for driving the light-emitting element.

17. The optical module according to claim 16, wherein the light-emitting element is an end face-emitting laser diode or a surface-emitting laser diode, and the semiconductor element is a laser drive element.

18. The optical module according to claim 1, wherein the passive element comprises a pair of passive element electrodes sandwiching the dielectric layer, the resistive layer, or the magnetic layer, and at least one of the pair passive element electrodes is partitioned into at least one of the pair passive element electrodes is partitioned into a plurality of units within the surface.

19. The optical module according to claim 1, further comprising an optical waveguide for guiding light and a bench including a groove for securing the optical waveguide.

20. The optical module according to claim 19, wherein the groove fastens the optical waveguide so that an optical axis of the optical waveguide is substantially parallel to a principle face of the substrate.

21. The optical module according to claim 19, wherein the groove fastens the optical waveguide so that an optical axis of the optical waveguide is substantially perpendicular to a principle face of the substrate.

22. The optical module according to claim 1, further comprising an optical waveguide for guiding light and a groove for securing the optical waveguide;

wherein the groove is formed on the substrate and secures the optical waveguide so that an optical axis of the optical waveguide is substantially parallel to the principle face of the substrate.

23. The optical module according to claim 1, wherein the passive element is formed in plurality.

24. The optical module according to claim 1, wherein the optical element is a light-receiving element or a light-emitting element.

25. The optical module according to claim 1, wherein the insulating layer of the substrate is a low sintering temperature glass ceramic with an inorganic sintered material as a primary component, and the dielectric layer of the passive element includes a lead-based perovskite compound as a primary component.

26. The optical module according to claim 1, wherein the insulating layer of the substrate is a low sintering temperature glass ceramic with an inorganic sintered material as a primary component, and the resistive layer of the passive element includes $RuO_2$ as a primary component.

* * * * *

UNITED STATES PATENT AND TRADEMARK OFFICE
CERTIFICATE OF CORRECTION

PATENT NO. : 6,789,956 B2
DATED : September 14, 2004
INVENTOR(S) : Iwaki et al.

It is certified that error appears in the above-identified patent and that said Letters Patent is hereby corrected as shown below:

Column 25,
Lines 40-41, delete duplicative phrase "at least one of the pair passive element electrodes is partitioned into"

Signed and Sealed this

Twenty-sixth Day of April, 2005

JON W. DUDAS
*Director of the United States Patent and Trademark Office*